(12) United States Patent
Nakamura et al.

(10) Patent No.: US 7,534,670 B2
(45) Date of Patent: May 19, 2009

(54) SEMICONDUCTOR DEVICE AND MANUFACTURING METHOD OF THE SAME

(75) Inventors: Osamu Nakamura, Atsugi (JP); Masayuki Kajiwara, Atsugi (JP); Shunpei Yamazaki, Setagaya (JP); Hideto Ohnuma, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 287 days.

(21) Appl. No.: 11/148,288

(22) Filed: Jun. 9, 2005

(65) Prior Publication Data
US 2005/0227422 A1  Oct. 13, 2005

Related U.S. Application Data

(62) Division of application No. 10/056,055, filed on Jan. 28, 2002, now Pat. No. 7,115,453.

(30) Foreign Application Priority Data

Jan. 29, 2001  (JP) ............................. 2001-019367

(51) Int. Cl.
*H01L 21/337* (2006.01)
(52) U.S. Cl. ................. 438/166; 438/149; 438/162; 438/487; 257/E21.415
(58) Field of Classification Search .......... 438/149, 438/162, 166, 487; 257/E21.415
See application file for complete search history.

(56) References Cited

U.S. PATENT DOCUMENTS

| | | | |
|---|---|---|---|
| 3,535,775 A | 10/1970 | Garfinkel et al. | |
| 4,371,403 A | 2/1983 | Ikubo et al. | |
| 4,477,308 A | 10/1984 | Gibson et al. | |
| 4,534,820 A | 8/1985 | Mori et al. | |
| 4,727,044 A | 2/1988 | Yamazaki | |
| 5,236,850 A * | 8/1993 | Zhang | ........................ 438/166 |
| 5,244,819 A | 9/1993 | Yue | |

(Continued)

FOREIGN PATENT DOCUMENTS

EP  0 651 431  5/1995

(Continued)

OTHER PUBLICATIONS

Specification and drawings of U.S. Appl. No. 08/784,293, filed Jan. 16, 1997 entitled "Fabrication Method of Semiconductor Device," along with pending claims as of Jun. 7, 2002.

(Continued)

*Primary Examiner*—Asok K Sarkar
(74) *Attorney, Agent, or Firm*—Eric J. Robinson; Robinson Intellectual Property Law Office, P.C.

(57) ABSTRACT

Provided is a technique of effectively removing a metallic element that has catalytic action in terms of the crystallization of a semiconductor film and remains in a semiconductor film obtained using the metallic element. With the technique of the present invention, to remove a catalytic element used to crystallize a semiconductor film having an amorphous structure, gettering is completed by forming a region or a semiconductor film, to which a rare gas element is added, and by having the catalytic element move to the formed region or semiconductor film.

32 Claims, 25 Drawing Sheets

U.S. PATENT DOCUMENTS

| | | | |
|---|---|---|---|
| 5,248,630 A | 9/1993 | Serikawa et al. |
| 5,275,896 A | 1/1994 | Garofalo |
| 5,403,772 A | 4/1995 | Zhang et al. |
| 5,426,064 A | 6/1995 | Zhang et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |
| 5,550,070 A | 8/1996 | Funai et al. |
| 5,551,984 A | 9/1996 | Tanahashi |
| 5,563,426 A | 10/1996 | Zhang et al. |
| 5,569,610 A | 10/1996 | Zhang et al. |
| 5,569,936 A | 10/1996 | Zhang et al. |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,663,077 A | 9/1997 | Adachi et al. |
| 5,677,549 A | 10/1997 | Takayama et al. |
| 5,696,003 A | 12/1997 | Makita et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,744,824 A | 4/1998 | Kousai et al. |
| 5,773,327 A | 6/1998 | Yamazaki et al. |
| 5,789,284 A | 8/1998 | Yamazaki et al. |
| 5,814,540 A | 9/1998 | Takemura et al. |
| 5,843,225 A | 12/1998 | Takayama et al. |
| 5,851,860 A | 12/1998 | Makita et al. |
| 5,869,363 A | 2/1999 | Yamazaki et al. |
| 5,888,858 A | 3/1999 | Yamazaki et al. |
| 5,893,730 A | 4/1999 | Yamazaki et al. |
| 5,897,347 A | 4/1999 | Yamazaki et al. |
| 5,915,174 A | 6/1999 | Yamazaki et al. |
| 5,923,962 A | 7/1999 | Ohtani et al. |
| 5,932,893 A | 8/1999 | Miyanaga et al. |
| 5,949,115 A | 9/1999 | Yamazaki et al. |
| 5,956,579 A | 9/1999 | Yamazaki et al. |
| 5,960,252 A | 9/1999 | Matsuki et al. |
| 5,961,743 A | 10/1999 | Yamazaki et al. |
| 5,970,327 A | 10/1999 | Makita et al. |
| 5,977,559 A | 11/1999 | Zhang et al. |
| 5,985,740 A | 11/1999 | Yamazaki et al. |
| 5,997,286 A | 12/1999 | Hemsath et al. |
| 5,998,838 A | 12/1999 | Tanabe et al. |
| 6,013,544 A | 1/2000 | Makita et al. |
| 6,015,593 A | 1/2000 | Yonkoski et al. |
| 6,022,458 A | 2/2000 | Ichikawa |
| 6,027,987 A | 2/2000 | Yamazaki et al. |
| 6,048,758 A | 4/2000 | Yamazaki et al. |
| 6,063,654 A | 5/2000 | Ohtani |
| 6,066,518 A | 5/2000 | Yamazaki |
| 6,071,764 A | 6/2000 | Zhang et al. |
| 6,071,766 A | 6/2000 | Yamazaki et al. |
| 6,072,193 A | 6/2000 | Ohnuma et al. |
| 6,077,731 A | 6/2000 | Yamazaki et al. |
| 6,077,758 A | 6/2000 | Zhang et al. |
| 6,083,324 A | 7/2000 | Henley et al. |
| 6,084,247 A | 7/2000 | Yamazaki et al. |
| 6,087,679 A | 7/2000 | Yamazaki et al. |
| 6,093,934 A | 7/2000 | Yamazaki et al. |
| 6,100,562 A | 8/2000 | Yamazaki et al. |
| 6,111,557 A | 8/2000 | Koyama et al. |
| 6,121,660 A | 9/2000 | Yamazaki et al. |
| 6,133,073 A | 10/2000 | Yamazaki et al. |
| 6,133,075 A | 10/2000 | Yamazaki et al. |
| 6,133,119 A | 10/2000 | Yamazaki |
| 6,153,445 A | 11/2000 | Yamazaki et al. |
| 6,156,590 A | 12/2000 | Yamazaki et al. |
| 6,156,628 A | 12/2000 | Ohnuma et al. |
| 6,160,268 A | 12/2000 | Yamazaki |
| 6,162,667 A | 12/2000 | Funai et al. |
| 6,162,704 A | 12/2000 | Yamazaki et al. |
| 6,165,824 A | 12/2000 | Takano et al. |
| 6,168,980 B1 | 1/2001 | Yamazaki et al. |
| 6,168,981 B1 | 1/2001 | Battaglia et al. |
| 6,180,439 B1 | 1/2001 | Yamazaki et al. |
| 6,184,559 B1 | 2/2001 | Hayakawa et al. |
| 6,194,255 B1 | 2/2001 | Hiroki et al. |
| 6,197,624 B1 | 3/2001 | Yamazaki |
| 6,201,585 B1 | 3/2001 | Takano et al. |
| 6,204,101 B1 | 3/2001 | Yamazaki et al. |
| 6,204,154 B1 | 3/2001 | Zhang et al. |
| 6,207,969 B1 | 3/2001 | Yamazaki |
| 6,218,219 B1 | 4/2001 | Yamazaki et al. |
| 6,225,152 B1 | 5/2001 | Yamazaki et al. |
| 6,232,205 B1 | 5/2001 | Ohtani |
| 6,232,621 B1 | 5/2001 | Yamazaki et al. |
| 6,242,290 B1 | 6/2001 | Nakajima et al. |
| 6,251,712 B1 | 6/2001 | Tanaka et al. |
| 6,255,195 B1 | 7/2001 | Linn et al. |
| 6,285,042 B1 | 9/2001 | Ohtani et al. |
| 6,287,900 B1 | 9/2001 | Yamazaki et al. |
| 6,287,988 B1 | 9/2001 | Nagamine et al. |
| 6,291,275 B1 | 9/2001 | Yamazaki et al. |
| 6,294,441 B1 | 9/2001 | Yamazaki |
| 6,300,659 B1 | 10/2001 | Zhang et al. |
| 6,303,415 B1 | 10/2001 | Yamazaki |
| 6,303,963 B1 | 10/2001 | Ohtani et al. |
| 6,306,694 B1 | 10/2001 | Yamazaki et al. |
| 6,307,214 B1 | 10/2001 | Ohtani et al. |
| 6,316,789 B1 | 11/2001 | Yamazaki et al. |
| 6,316,810 B1 | 11/2001 | Yamazaki et al. |
| 6,331,457 B1 | 12/2001 | Yamazaki et al. |
| 6,337,259 B1 | 1/2002 | Ueda et al. |
| 6,346,730 B1 | 2/2002 | Kitakado et al. |
| 6,362,507 B1 | 3/2002 | Ogawa et al. |
| 6,376,336 B1 | 4/2002 | Buynoski |
| 6,391,690 B2 | 5/2002 | Miyasaka |
| 6,396,147 B1 | 5/2002 | Adachi et al. |
| 6,399,454 B1 | 6/2002 | Yamazaki |
| 6,399,988 B1 | 6/2002 | Yamazaki |
| 6,420,758 B1 | 7/2002 | Nakajima |
| 6,426,276 B1 | 7/2002 | Ohnuma et al. |
| 6,429,097 B1 | 8/2002 | Voutsas et al. |
| 6,436,745 B1 | 8/2002 | Gotou et al. |
| 6,461,943 B1 | 10/2002 | Yamazaki et al. |
| 6,489,189 B2 | 12/2002 | Yamazaki et al. |
| 6,512,504 B1 | 1/2003 | Yamauchi et al. |
| 6,531,713 B1 | 3/2003 | Yamazaki |

| | | |
|---|---|---|
| 6,534,826 B2 | 3/2003 | Yamazaki |
| 6,541,294 B1 | 4/2003 | Yamazaki et al. |
| 6,576,926 B1 | 6/2003 | Yamazaki et al. |
| 6,579,736 B2 | 6/2003 | Yamazaki |
| RE38,266 E | 10/2003 | Yamazaki et al. |
| 6,680,577 B1 | 1/2004 | Inukai et al. |
| 6,686,262 B2 | 2/2004 | Yamazaki et al. |
| 6,709,902 B2 | 3/2004 | Kitakado et al. |
| 6,737,304 B2 | 5/2004 | Yamazaki et al. |
| 6,743,649 B2 | 6/2004 | Yamazaki et al. |
| 6,743,700 B2 | 6/2004 | Asami et al. |
| 6,808,968 B2 | 10/2004 | Yamazaki et al. |
| 6,812,081 B2 | 11/2004 | Yamazaki et al. |
| 6,821,828 B2 | 11/2004 | Ichijo et al. |
| 6,962,837 B2 | 11/2005 | Yamazaki |
| 7,129,120 B2 | 10/2006 | Yamazaki |
| 2001/0034088 A1 | 10/2001 | Nakamura et al. |
| 2002/0028543 A1 | 3/2002 | Yamazaki et al. |
| 2002/0086469 A1 | 7/2002 | Kim et al. |
| 2002/0098628 A1 | 7/2002 | Hamada et al. |
| 2002/0102764 A1 | 8/2002 | Yamazaki et al. |
| 2002/0106861 A1 | 8/2002 | Yamazaki |
| 2002/0125480 A1 | 9/2002 | Nakamura et al. |
| 2002/0142554 A1 | 10/2002 | Nakajima |
| 2002/0151120 A1 | 10/2002 | Yamazaki et al. |
| 2002/0151154 A1 | 10/2002 | Yamazaki et al. |
| 2002/0164843 A1 | 11/2002 | Yamazaki et al. |
| 2002/0182783 A1 | 12/2002 | Takayama et al. |
| 2002/0187594 A1 | 12/2002 | Yamazaki et al. |
| 2002/0197785 A1 | 12/2002 | Yamazaki et al. |
| 2003/0060057 A1 | 3/2003 | Raaijmakers et al. |
| 2003/0062499 A1 | 4/2003 | Yamazaki |
| 2003/0122129 A1 | 7/2003 | Yamazaki et al. |
| 2003/0132900 A1 | 7/2003 | Yamauchi et al. |
| 2003/0197179 A1 | 10/2003 | Yamazaki et al. |
| 2003/0232468 A1 | 12/2003 | Ohnuma |
| 2004/0065902 A1 | 4/2004 | Yamazaki et al. |
| 2004/0101997 A1 | 5/2004 | Maekawa et al. |
| 2004/0121530 A1 | 6/2004 | Yamazaki et al. |
| 2004/0224486 A1 | 11/2004 | Ichijo et al. |
| 2005/0009257 A1 | 1/2005 | Yamazaki et al. |
| 2005/0020037 A1 | 1/2005 | Asami et al. |
| 2005/0079656 A1 | 4/2005 | Ichijo et al. |

FOREIGN PATENT DOCUMENTS

| | | |
|---|---|---|
| JP | 05-109737 | 4/1993 |
| JP | 06-151414 | 5/1994 |
| JP | 07-130652 | 5/1995 |
| JP | 07-183540 | 7/1995 |
| JP | 08-078329 | 3/1996 |
| JP | 08-213316 | 8/1996 |
| JP | 09-074207 | 3/1997 |
| JP | 09-205123 | 8/1997 |
| JP | 10-055951 | 2/1998 |
| JP | 11-031660 | 2/1999 |
| JP | 3032801 | 2/2000 |
| JP | 2000-105081 | 4/2000 |
| JP | 3032801 | 4/2000 |
| JP | 2000-260777 | 9/2000 |
| JP | 2001-210828 | 8/2001 |
| JP | 2001-267264 | 9/2001 |

OTHER PUBLICATIONS

Kevin S. Jones et al., "Boron Diffusion Upon Annealing of Laser Thermal Processed Silicon," Ion Implantation Technology 2000, Conference on, 2000, pp. 111-114.

M. Miyake et al., "Characteristics of Buried-Channel pMOS Devices with Shallow Counter-Doped Layers Fabricated Using Channel Preamorphization," IEEE Transactions on Electron Devices, vol. 43, No. 3, Mar. 1996, pp. 444-449.

L. S. Lee et al., "Argon Ion-Implantation of Polysilicon or Amorphous-Silicon for Boron Penetration Suppression in p+ pMOSFET," IEEE Transactions on Electron Devices, vol. 45, No. 8, Aug. 1998, pp. 1737-1744.

D.J. Llewellyn et al., "Implantation and Annealing of Cu in InP for Electrical Isolation: Microstructural Characterisation," Optoelectronic and Microelectronic Materials and Devices Proceedings, IEEE Electron Device Letters, 1996, pp. 313-316.

* cited by examiner

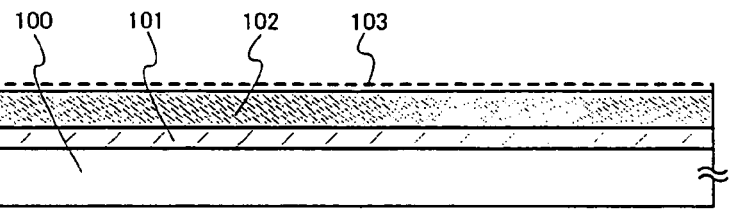
Fig. 1A
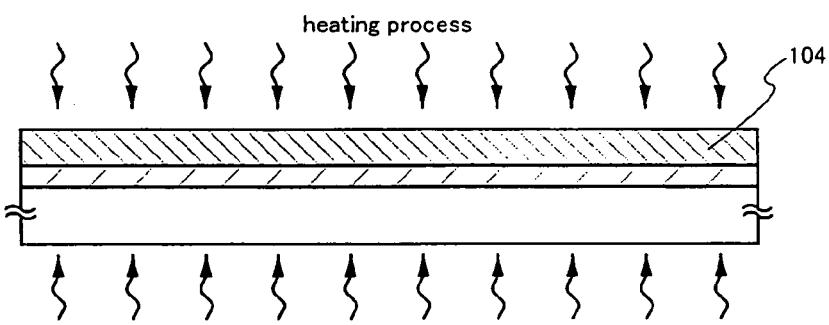
Fig. 1B
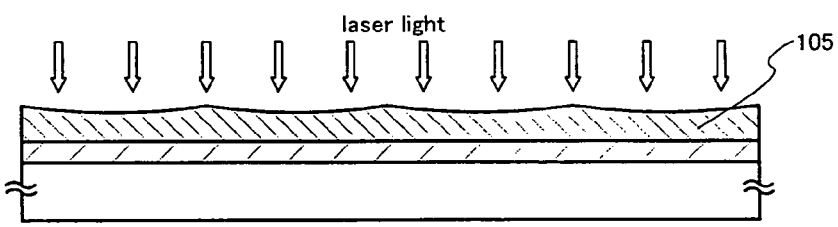
Fig. 1C
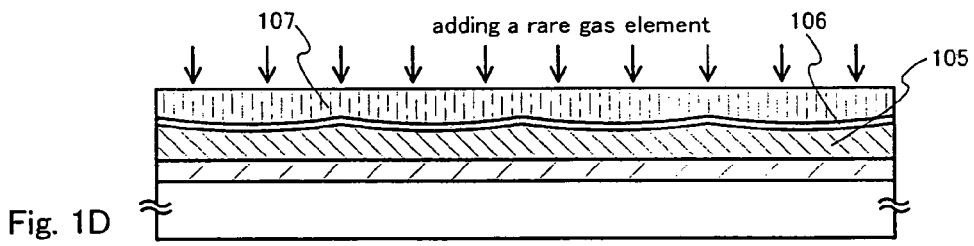
Fig. 1D
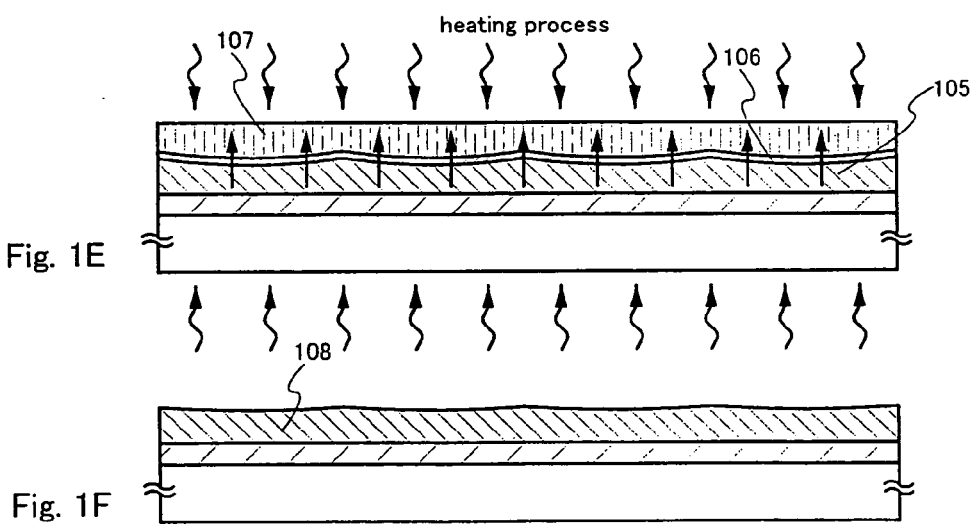
Fig. 1E
Fig. 1F

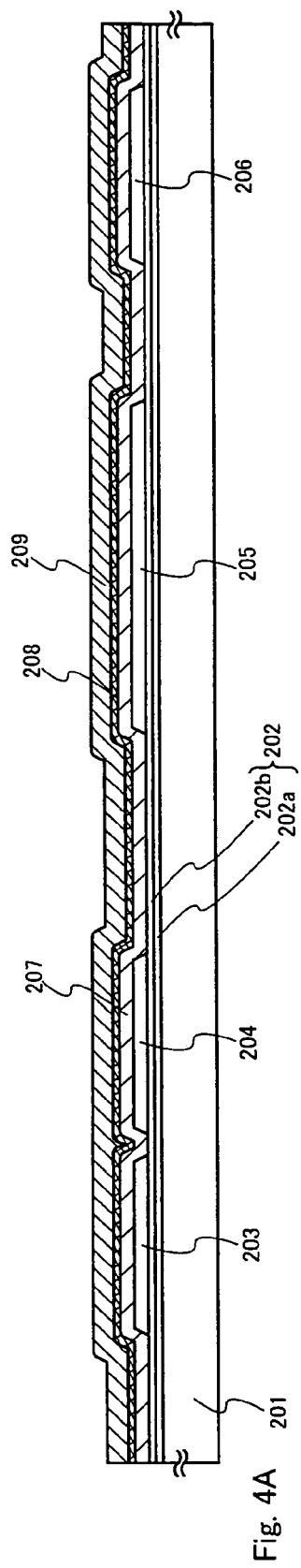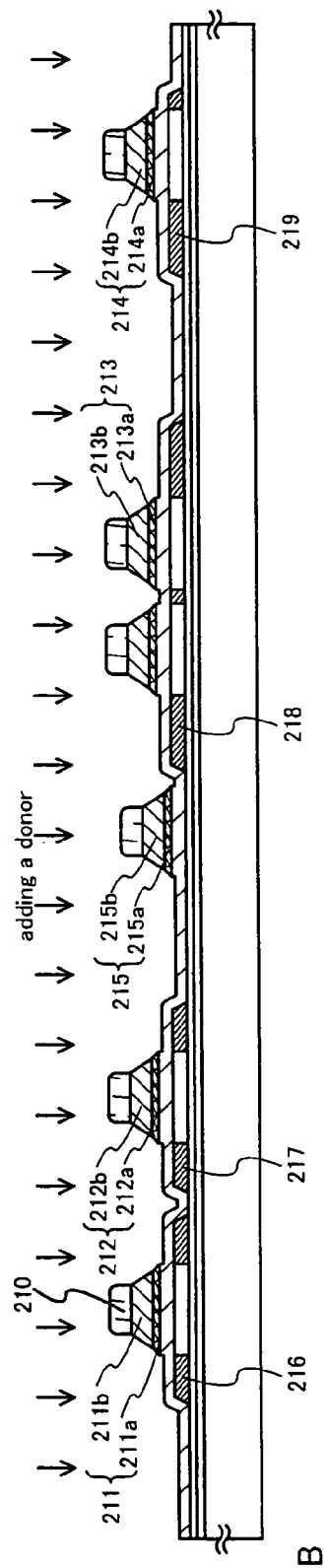
Fig. 4A
Fig. 4B

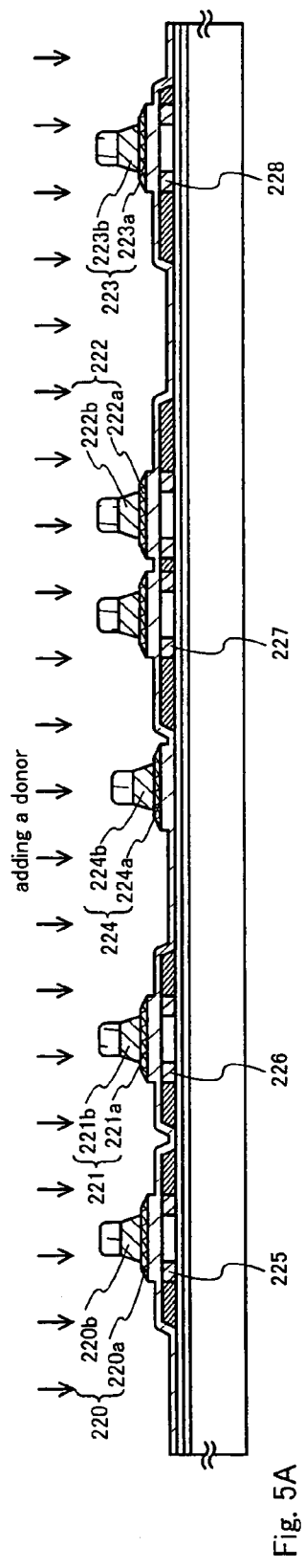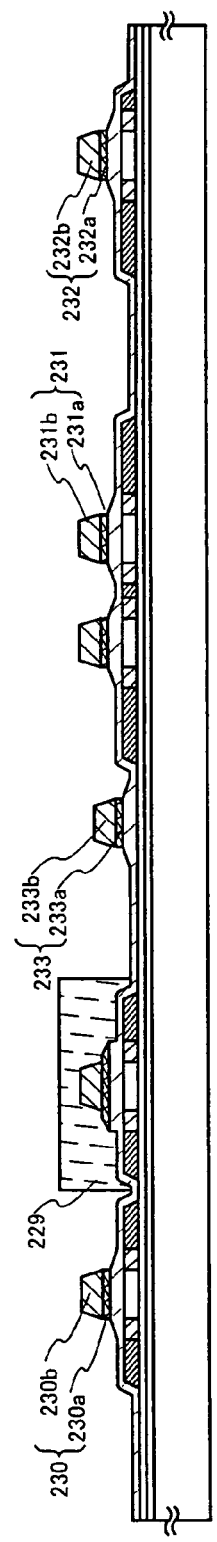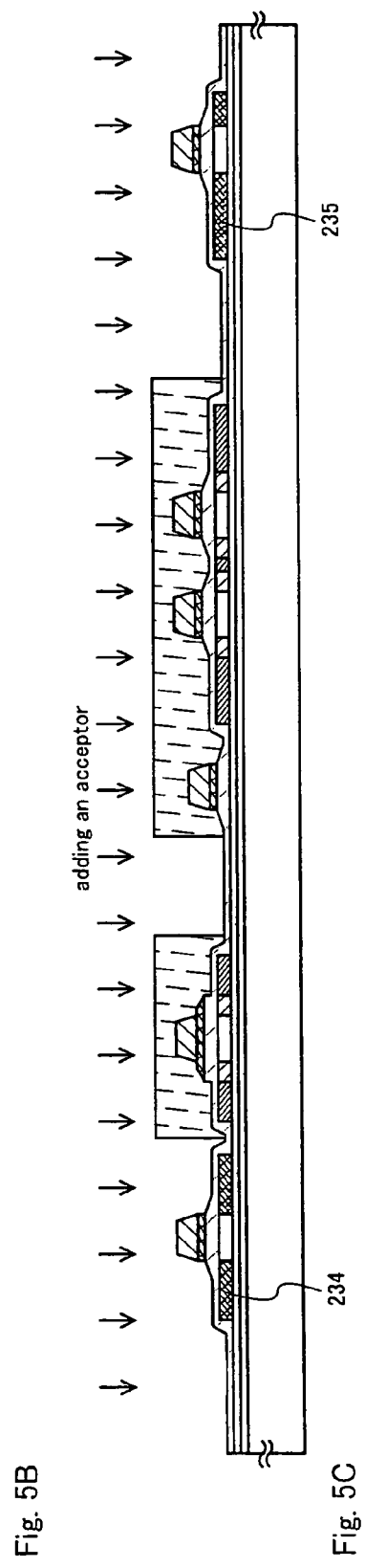
Fig. 5A
Fig. 5B
Fig. 5C

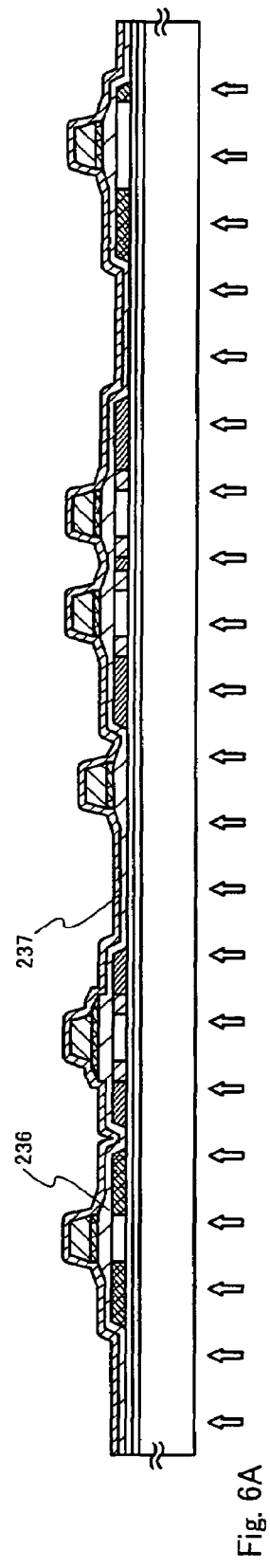
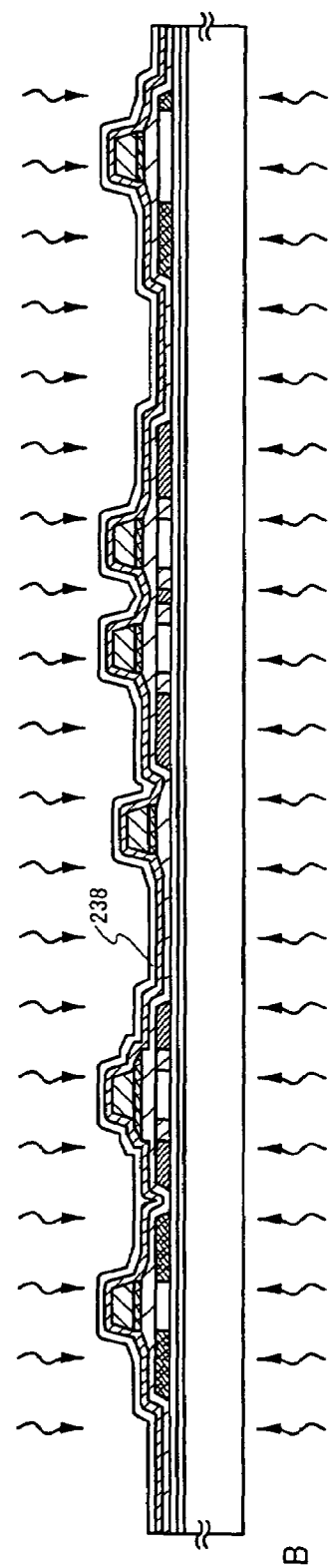

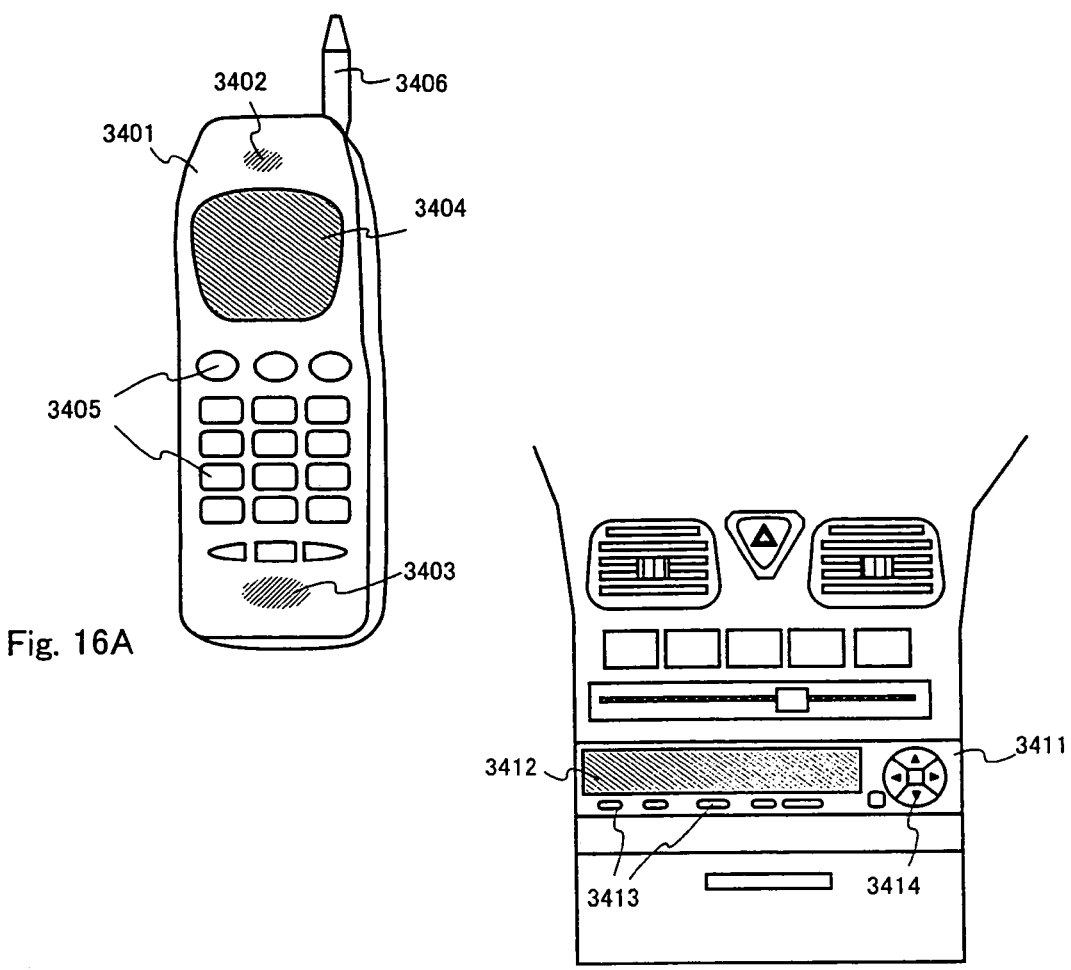
Fig. 16A
Fig. 16B
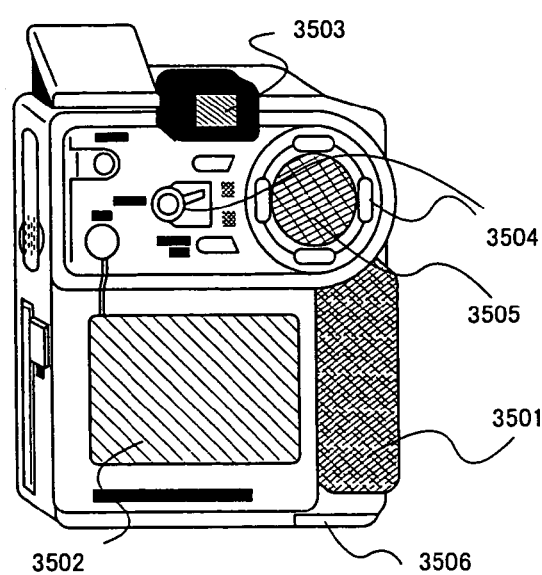
Fig. 16C

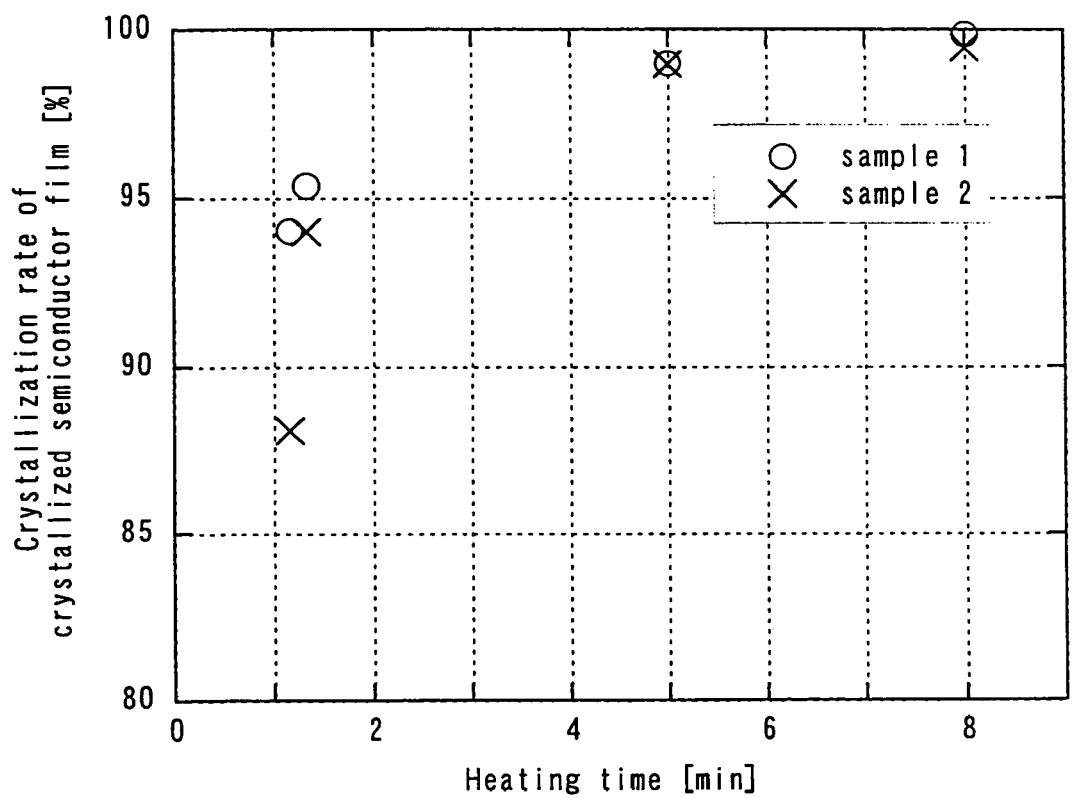
Fig. 17 Relation between heating time and crystallization rate by GRTA method.
Ni concentration added to amouphous silicon film: 10 ppm, warm-up period to 650°C by GRTA method: 3' 30, observation: optical microscope ×1000 transmission.

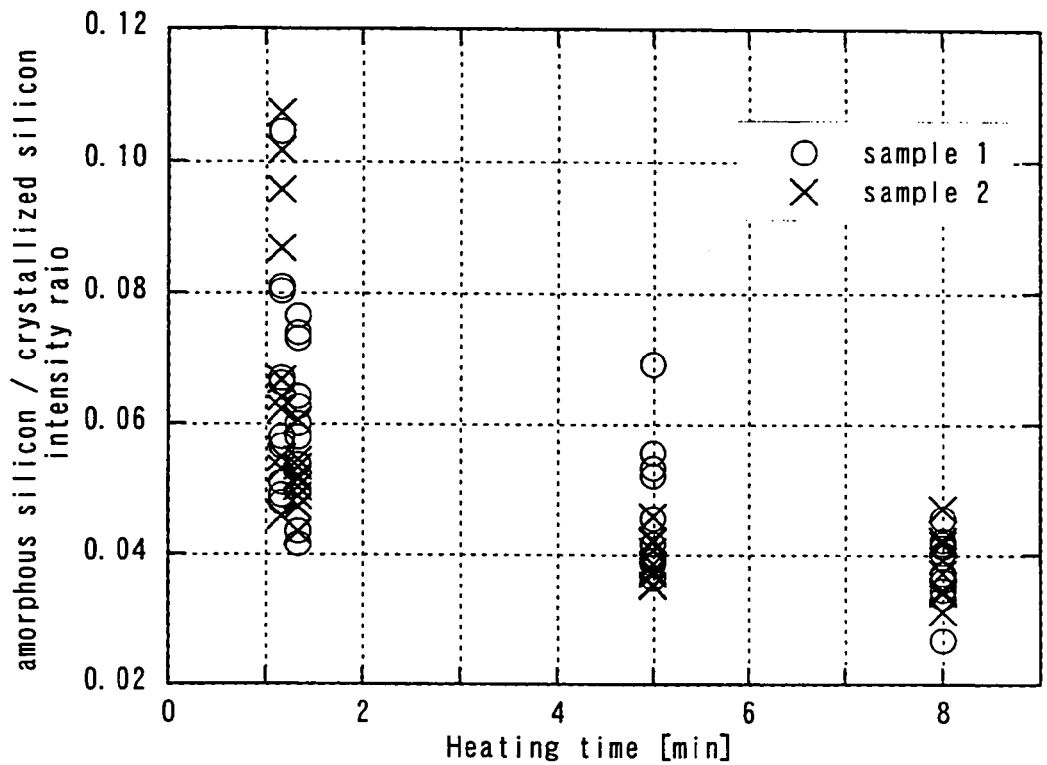
Fig. 18 Heating time dependency of peak intensity ratio of TO ( amorphous silicon: 480 cm$^{-1}$) and TO (crystallized silicon: apploximately 520 cm$^{-1}$).
Ni concentration added to amouphous silicon film: 10 ppm, warm-up period to 650°C by GRTA method: 3'30, observation: optical microscope ×1000 transmission, Raman: ×500, 20sec.

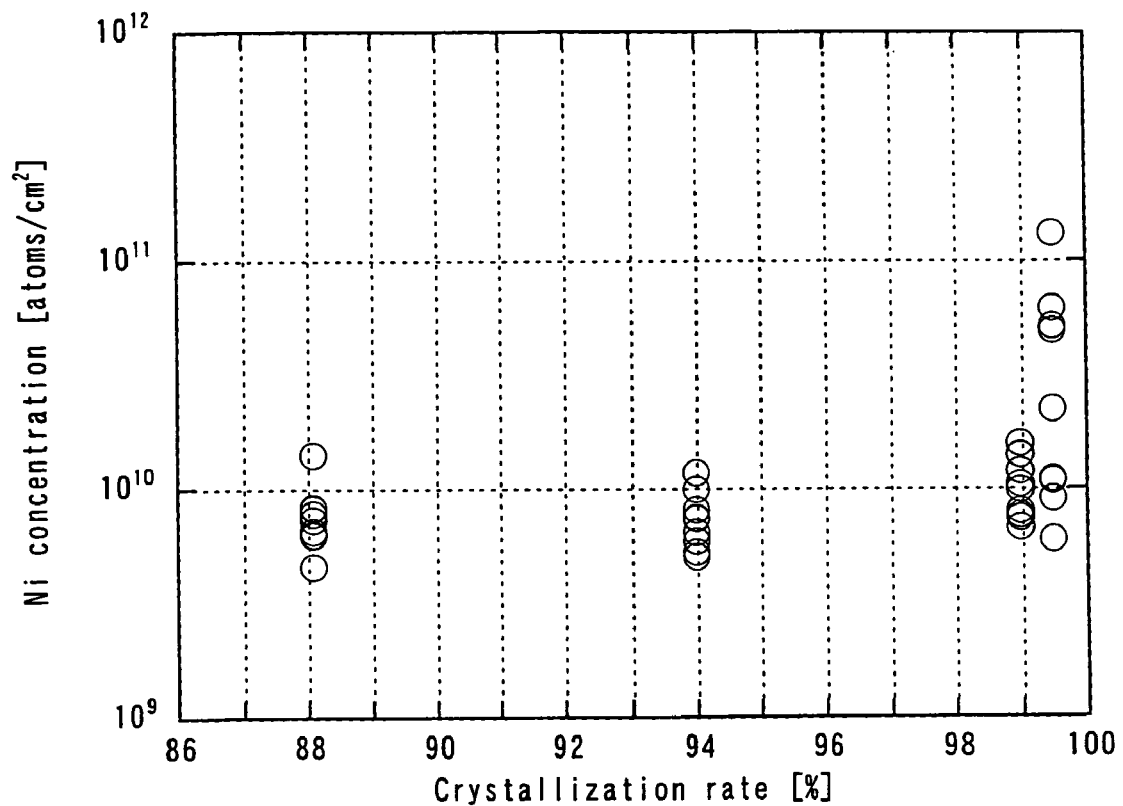
Fig. 19  Relation between crystallization rate and residual nickel concentration (temperature in gettering: 625°C).
Ni concentration added to amouphous silicon film: 10 ppm, warm-up period to 625°C by GRTA method: 3' 30, observation: optical microscope ×1000 transmission, gettering site: amorphous silicon film of 500 Å to which Ar is added.

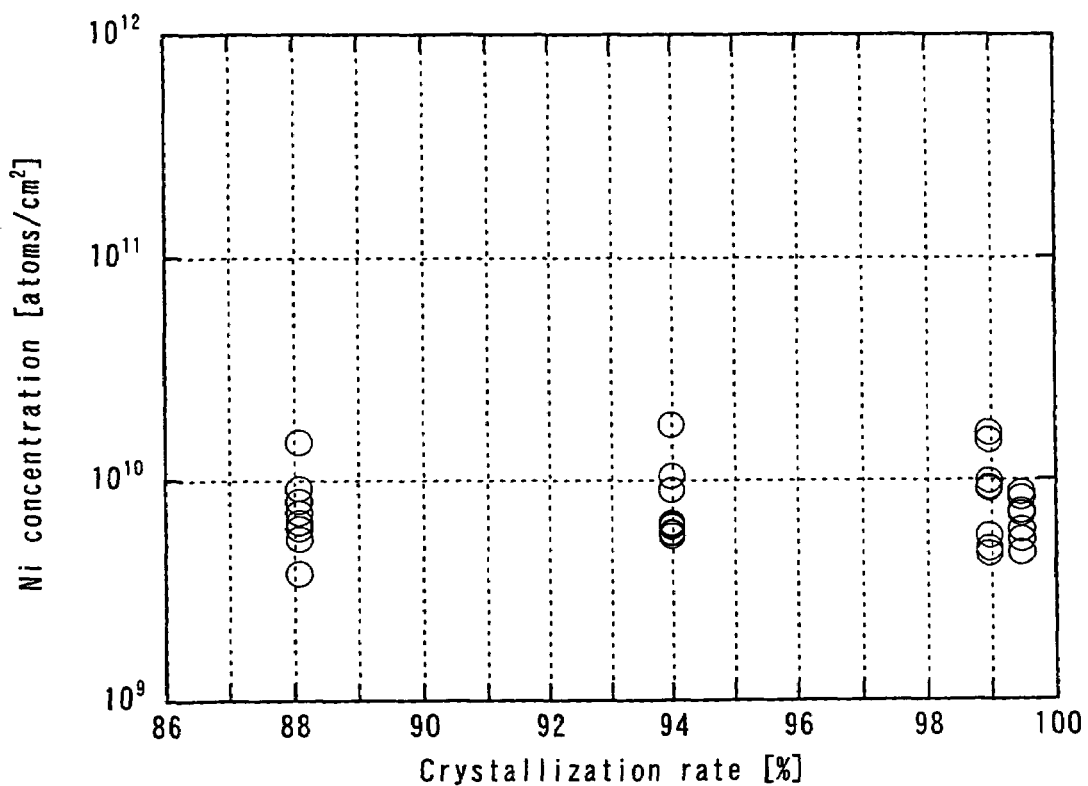
Fig. 20 Relation between crystallization rate and residual nickel concentration (temperature in gettering: 650°C).
Ni concentration added to amouphous silicon film: 10 ppm, warm-up period to 650°C by GRTA method: 3' 30, observation: optical microscope ×1000 transmission, gettering site: amorphous silicon of 500 Å to which Ar is added.

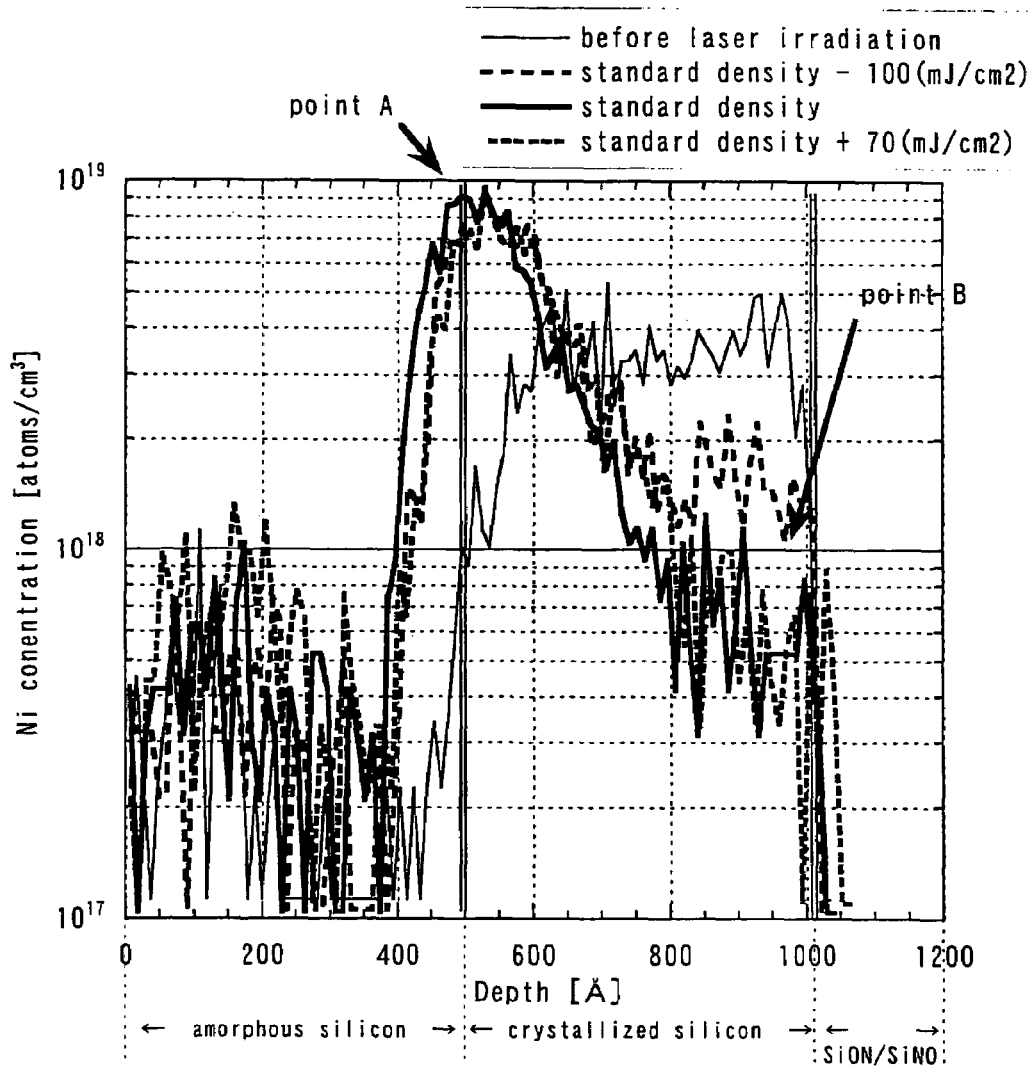
Fig. 21 Ni concentration distribution in semiconductor film by secondary ion composition analysis method.
point A: Ni concentration increases in upper portion of crystallized silicon film as energy density of laser light increases.
point B: Ni concentration decreases in lower portion of crystallized silicon film as energy density of laser light increases.

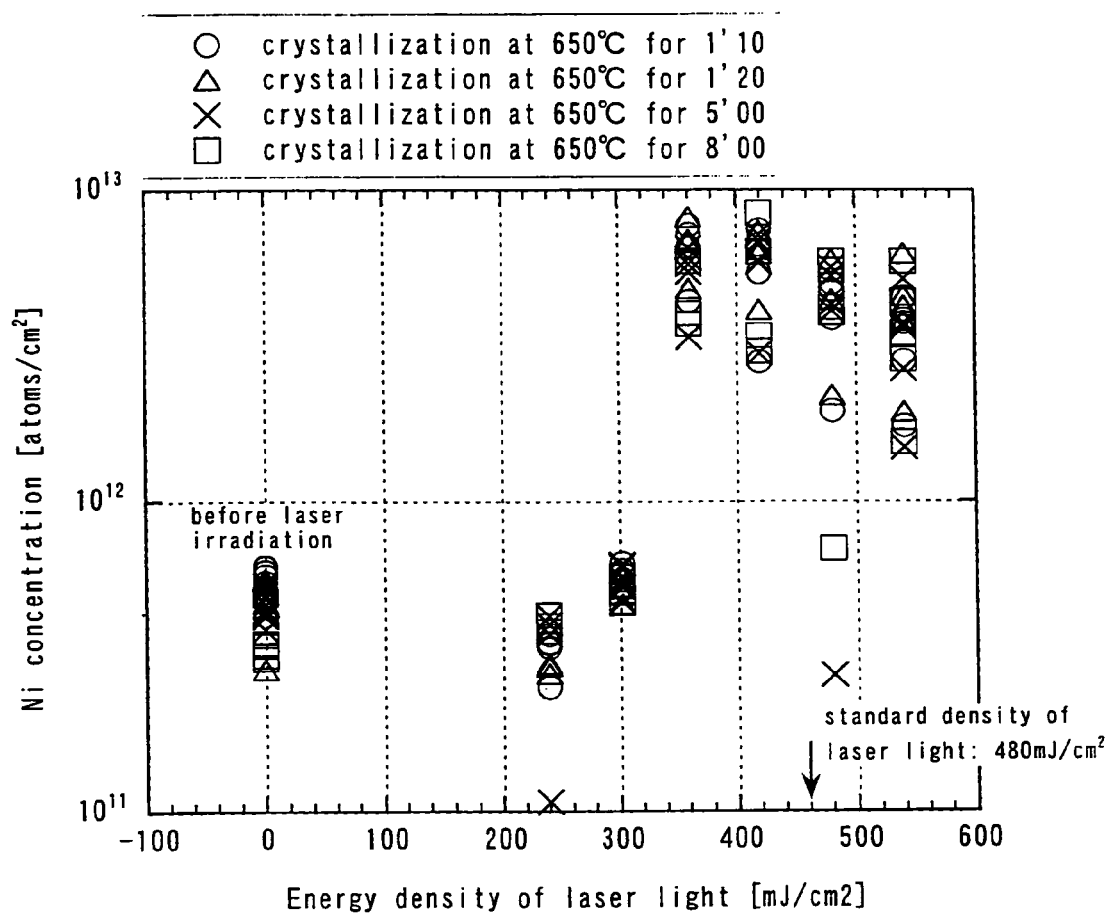
Fig. 22 Energy density dependency of laser light of Ni concentration at a surface of semiconductor film.

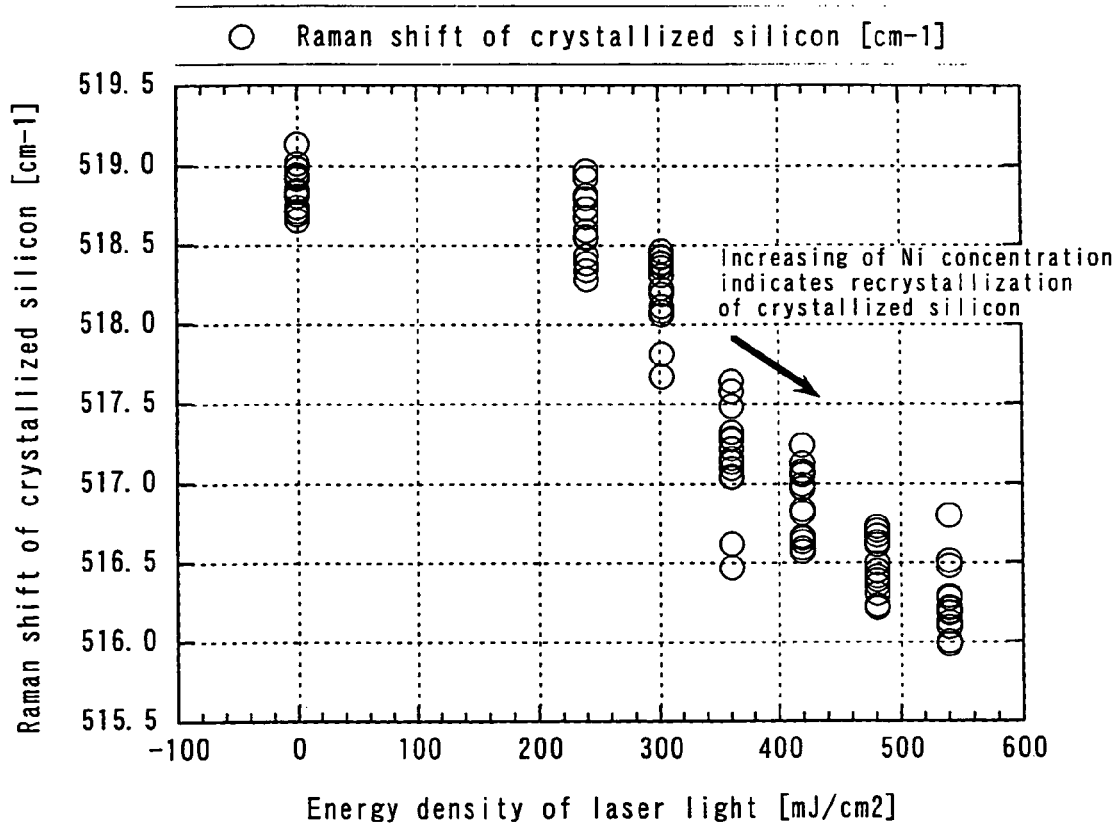
Fig. 23 Energy density dependency of laser light of Raman shift in semiconductor film.
Ni concentration added to amporphous silicon film: 10ppm, warm-up period to 650°C: 3'30, heating time: 1'20, Raman: ×500, 15sec, 15 points, 5μm pitch.

accelating voltage: 200kV
 (wavelength: 2.51 Å )
camera length: 0.4m (on figure: 0.8m)
beam diameter: approximately 10 Å $\phi$ Table. 1
Distance of lattice planes and corresponding crystal orientation.

| distance of lattice planes | crystal |
|---|---|
| 2.677 Å | $Ni_3Si_2(420)=2.6637$ Å<br>$Ni_3Si_2(330)=2.700$ Å<br>$Ni_2Si(122)=2.68$ Å |
| 3.08 Å | Si(111) |
| 1.24 Å | Si(331) |

SEMICONDUCTOR DEVICE AND MANUFACTURING METHOD OF THE SAME

BACKGROUND OF THE INVENTION

1. Field of the Invention

The present invention relates to a semiconductor device, which uses a semiconductor film having a crystal structure, and a manufacturing method of the semiconductor device. More particularly, the present invention relates to a semiconductor device typified by a thin-film transistor (hereinafter referred to as the "TFT") and a manufacturing method of the semiconductor device. It should be noted here that in this specification, the term "semiconductor device" refers to the whole of devices that operate by utilizing semiconductor characteristics.

2. Description of the Related Art

In order to form an integrated circuit using TFTs, there has been attached importance to a technique of forming semiconductor films having crystal structures on an insulating surface. This is because the semiconductor films are used to form active layers of TFTs (in this specification, the active layers include channel forming regions, source regions, and drain regions) and therefore, the quality of the semiconductor films is a factor that directly determines the electric characteristics of the TFTs.

As a method of forming a semiconductor film having a crystal structure, there is used a method with which crystallization is performed through the irradiation with laser light after an amorphous semiconductor film is formed. Alternatively, there is used a method with which crystallization is performed through a heating process using an electric heating furnace. However, a semiconductor film produced using these methods is composed of a plurality of crystal grains and the crystal orientation thereof is oriented in an arbitrary direction. Therefore, it is impossible to control the crystal orientation. This becomes a factor that hinders the smooth movement of carriers and limits the electric characteristics of a TFT, in comparison with the case of a single crystal semiconductor.

In view of this problem, Japanese Patent Application Laid-open No. Hei 7-183540 discloses a technique with which a silicon semiconductor film is crystallized through the addition of a metallic element such as nickel. It is publicly known that this technique achieves an effect that crystallization is promoted by the metallic element functioning as a catalyst and the temperature required for the crystallization is decreased. In addition to this effect, it also becomes possible to enhance the orientation property of crystal orientation. It is publicly known that an element having the catalytic action is one type or a plurality of types selected from the group consisting of Fe, Ni, Co, Ru, Rh, Pd, Os, Ir, Pt, Cu, and Au.

However, the addition of such a metallic element having the catalytic action (in this specification, every metallic element having the catalytic action is referred to as the "catalytic element") causes various problems, such as a problem that the metallic element remains within a semiconductor film or on the surface of the semiconductor film and causes variations of electric characteristics of a TFT. For instance, there occurs a problem that the off-current of a TFT increases and there occurs differences in off-current between respective devices. That is, once a crystalline semiconductor film is formed, the metallic element having the catalytic action in terms of crystallization becomes a substance that is contrarily unnecessary.

With a gettering technique using phosphorus, it is possible to remove the metallic element added to perform crystallization from a specific region of a semiconductor film even at a heating temperature of around 500° C. For instance, by performing a heating process at 450 to 700° C. after the addition of phosphorous to the source region/drain region of a TFT, it is possible to remove the metallic element added to perform crystallization from a device forming region without difficulty. An example of this technique is disclosed in Japanese Patent No. 3032801.

By the way, as the gettering technique, there have been known extrinsic gettering and intrinsic gettering. In the extrinsic gettering, a gettering effect is achieved by giving a strain field or chemical action to a silicon wafer from the outside. On the other hand, in the intrinsic gettering, the gettering effect is achieved by utilizing a strain field caused by lattice defects due to oxygen generated within a wafer. As the extrinsic gettering, there have been known a method with which mechanical damage is given to the back surface (a surface on the side opposite to a surface on which a device is to be formed) of a silicon wafer, a method with which a polycrystalline silicon film is formed, a method with which phosphorous is diffused, and the like. There is also known a gettering technique with which a strain field is formed using secondary lattice defects resulting from ion implantation. These techniques have evolved until today as a technique of manufacturing a large scale integrated circuit using a single crystal silicon substrate and have been developed based on the premise that a silicon wafer is used. There are included experimental elements in the developed techniques. At all events, the gettering is a technique with which metallic impurities and the like contained in a semiconductor are accumulated in a predetermined region (a gettering site) by moving the metallic impurities and the like with any energy, thereby reducing the concentration of the metallic impurities in a device forming region (a gettering target region).

Phosphorous is used as a donor in a wide variety of semiconductor devices to form n-type semiconductor regions and is an element that is known as a dopant. Accordingly, it is possible to incorporate gettering using phosphorous into a manufacturing process of TFTs with relative ease. The gettering using phosphorous makes it possible to remove a metallic element introduced into a semiconductor film for the crystallization of silicon by performing a heating process at 550° C. for around four hours. However, this in turn causes a problem that the concentration of phosphorous that needs to be added to a semiconductor film is $1\times10^{20}/cm^3$ or higher, preferably $1\times10^{21}/cm^3$, and therefore the processing time required to perform doping is elongated. Further, the addition of phosphorous with an ion implantation method or an ion doping method (referring to a method with which there is not performed mass separation of ions to be implanted, in this specification) brings about an amorphous state of a semiconductor film and the addition of dense phosphorous causes the difficulty of recrystallization afterward.

SUMMARY OF THE INVENTION

The present invention is a means for solving these problems and an object of the present invention is to provide a technique of effectively removing a metallic element that has the catalytic action in terms of crystallization of a semiconductor film and remains in a semiconductor film obtained using the metallic element.

To solve the stated problems, the present invention is characterized in that to remove a catalytic element used to crystallize a semiconductor film having an amorphous structure, gettering is completed by forming a region or a semiconductor film, to which a rare gas element is added, and by having the catalytic element move to the formed region or semiconductor film.

Concretely, a manufacturing method of a semiconductor device according to the present invention comprises the steps of: forming, on a substrate having an insulating surface, a first semiconductor film whose main ingredient is silicon and which has an amorphous structure; adding a catalytic element for promoting crystallization of the silicon to the first semiconductor film and performing a first heating process, thereby forming the first semiconductor film having a crystal structure; forming a barrier layer on a surface of the first semiconductor film having the crystal structure; forming a second semiconductor film on the barrier layer; adding a rare gas element to the second semiconductor film concurrently with or after the formation of the second semiconductor film and performing gettering through a second heating process, thereby moving the catalytic element to the second semiconductor film; and removing the second semiconductor film.

Also, a manufacturing method of a semiconductor device according to the present invention comprises the steps of: forming, on a substrate having an insulating surface, a first semiconductor film whose main ingredient is silicon and which has an amorphous structure; adding a catalytic element for promoting crystallization of the silicon to the first semiconductor film and performing a first heating process, thereby forming the first semiconductor film having a crystal structure; irradiating the first semiconductor film having the crystal structure with laser light; forming a barrier layer on a surface of the first semiconductor film having the crystal structure; forming a second semiconductor film on the barrier layer; adding a rare gas element to the second semiconductor film concurrently with or after the formation of the second semiconductor film and performing gettering through a second heating process, thereby moving the catalytic element to the second semiconductor film; and removing the second semiconductor film.

Also, a manufacturing method of a semiconductor device according to the present invention comprises the steps of: forming, on a substrate having an insulating surface, a first semiconductor film whose main ingredient is silicon and which has an amorphous structure; adding a catalytic element for promoting crystallization of the silicon to the first semiconductor film and performing a first heating process, thereby forming the first semiconductor film having a crystal structure; forming a barrier layer on a surface of the first semiconductor film having the crystal structure; forming a second semiconductor film on the barrier layer; adding a rare gas element to the second semiconductor film concurrently with or after the formation of the second semiconductor film and performing gettering through a second heating process, thereby moving the catalytic element to the second semiconductor film; removing the second semiconductor film; and irradiating the first semiconductor film having the crystal structure with laser light.

Also, a manufacturing method of a semiconductor device according to the present invention, comprises the steps of: forming, on a substrate having an insulating surface, a first semiconductor film whose main ingredient is silicon and which has an amorphous structure; adding a catalytic element promoting crystallization of the silicon to the first semiconductor layer having the amorphous structure; forming a barrier layer on a surface of the first semiconductor film having the amorphous substructure; forming a second semiconductor film on the barrier layer; adding a rare gas element to the second semiconductor film concurrently with or after the formation of the second semiconductor film; forming the first semiconductor film having a crystal structure by crystallizing the first semiconductor film having the amorphous structure and moving the catalytic element to the second semiconductor film, through a heating process; removing the second semiconductor film; and irradiating the first semiconductor film having the crystal structure with laser light.

Also, a manufacturing method of a semiconductor device according to the present invention, comprises the steps of: adding a catalytic element promoting crystallization of silicon on an insulating surface; forming a first semiconductor film, whose main ingredient is silicon and which has an amorphous structure, on a substrate having the insulating surface; forming a barrier layer on a surface of the first semiconductor film having the amorphous structure; forming a second semiconductor film on the first semiconductor film having the amorphous structure; adding a rare gas element to the second semiconductor film concurrently with or after the formation of the second semiconductor film; forming the first semiconductor film having a crystal structure by crystallizing the first semiconductor film having the amorphous structure and moving the catalytic element to the second semiconductor film, through a heating process; removing the second semiconductor film; and irradiating the first semiconductor film having the crystal structure with laser light.

The barrier layer may be formed from a chemical oxide film that is formed using ozone water, or the barrier layer may be formed by oxidizing a surface thereof through a plasma process, or by oxidizing a surface thereof by generating ozone through irradiation with ultraviolet rays in an oxygen containing atmosphere. Further, as the barrier layer, a silicon oxynitride film or the like may be formed with a sputtering method or a plasma CVD method.

The rare gas element added in order to form a gettering site is at least one type selected from the group consisting of He, Ne, Ar, Kr, and Xe. Further, the rare gas element is added using one of an ion implantation method and an ion doping method, or is taken at the same time when the second semiconductor film is formed.

Further, the first heating process for crystallization is performed with a rapid thermal annealing method by radiation from at least one type selected from the group consisting of a halogen lamp, a metal halide lamp, a xenon arc lamp, a carbon arc lamp, a high pressure sodium lamp, and a high pressure mercury lamp (hereinafter referred to as "LRTA method"), or with a rapid thermal annealing method in which the rare gas such as Ar and nitrogen is used as a heating medium (hereinafter referred to as "GRTA method"), or with a furnace annealing method that uses an electric heating furnace.

Further, the second heating process for gettering is performed with the LRTA method by radiation from at least one type selected from the group consisting of a halogen lamp, a metal halide lamp, a xenon arc lamp, a carbon arc lamp, a high pressure sodium lamp, and a high pressure mercury lamp, or with the GRTA method in which the rare gas such as Ar and nitrogen is used as a heating medium, or with the furnace annealing method that uses an electric heating furnace.

A structure of the present invention relates to a semiconductor device, which is manufactured with the above method, the device comprising: a semiconductor film that has a crystal structure and is provided on an insulating surface, in which a concentration of oxygen contained in the semiconductor film is equal to or less than $5 \times 10^{18}/cm^3$, and in which an area, in which a rare gas element is contained at a concentration of $1 \times 10^{13}$ to $1 \times 10^{20}/cm^3$, exists one of inside of the semiconductor layer and in a vicinity of a surface of the semiconductor layer.

Another structure of the present invention relates to a semiconductor device comprising: a semiconductor film that has a crystal structure and is provided on an insulating surface, in which: the semiconductor film is a crystal having one of a narrow bar shape and a narrow and flat bar shape; a concentration of oxygen contained in the semiconductor film is equal to or less than $5\times10^{18}/cm^3$; and an area, in which a rare gas element is contained at a concentration of $1\times10^{13}$ to $1\times10^{20}/cm^3$, exists one of inside of the semiconductor layer and in a vicinity of a surface of the semiconductor layer.

Still another structure of the present invention relates to a semiconductor device comprising: a semiconductor film that has a crystal structure and is provided on an insulating surface; a gate insulating film; and a gate electrode in which the semiconductor film contains oxygen at a concentration, which is equal to or less than $5\times10^{18}/cm^3$, in a region overlapping the gate electrode, and in which an area, in which a rare gas element is contained at a concentration of $1\times10^{13}$ to $1\times10^{20}/cm^3$, exists one of inside of the semiconductor film and in a vicinity of an interface with the gate insulating film.

A Further structure of the present invention relates to a semiconductor device comprising: a semiconductor film that has a crystal structure and is provided on an insulating surface; a gate insulating film; and a gate electrode, in which: the semiconductor film is a crystal having one of a narrow bar shape and a narrow and flat bar shape; the semiconductor film contains oxygen at a concentration, which is equal to or less than $5\times10^{18}/cm^3$, in a region overlapping the gate electrode; and an area, in which a rare gas element is contained at a concentration of $1\times10^{13}$ to $1\times10^{20}/cm^3$, exists one of inside of the semiconductor film and in a vicinity of an interface with the gate insulating film.

In accordance with another aspect of the invention, after crystallizing a semiconductor film by using a metal containing material capable of promoting crystallization, the crystallized semiconductor film is given an energy which is sufficient for melting the crystallized semiconductor film at least partly whereby the crystallized semiconductor film becomes the state in which the metal element present in the crystallized semiconductor film can be more easily removed by gettering. Therefore, it is one feature of the present invention that a gettering step is performed after making such a state.

In accordance with another aspect of the invention, the semiconductor film crystallized by using a metal containing crystallization promoting material is given an energy to change the metal concentration profile so that the metal concentration at the surface of the crystallized semiconductor film becomes larger.

In accordance with another aspect of the present invention, after a semiconductor film is crystallized by using a metal containing crystallization promoting material, the crystallized semiconductor film is given energy so that a proportion of $Ni_3Si_2$ or $Ni_2Si$ present in the grain boundaries is increased.

BRIEF DESCRIPTION OF THE DRAWINGS

In the accompanying drawings:

FIGS. 1A to 1F are each a cross sectional view illustrating a step for manufacturing a semiconductor device according to the present invention;

FIGS. 4A and 4B are each a cross sectional view illustrating steps for manufacturing an active matrix substrate that is produced with the technique of the present invention and is applicable to a reflection-type display apparatus;

FIGS. 5A to 5C are each a cross sectional view illustrating steps for manufacturing the active matrix substrate that is produced with the technique of the present invention and is applicable to the reflection-type display apparatus;

FIGS. 6A and 6B are each a cross sectional view illustrating steps for manufacturing the active matrix substrate that is produced with the technique of the present invention and is applicable to the reflection-type display apparatus;

FIGS. 16A to 16C each show an example of the semiconductor device.

FIG. 17 shows the relation between a heating time and crystallization rate by GRTA method;

FIG. 18 shows the heating time dependency of peak the intensity ratio of TO (amorphous silicon: 480 $cm^{-1}$) and TO (crystallized silicon: approximately 520 $cm^{-1}$) which are obtained from Raman spectrum;

FIG. 19 shows the relation between crystallization rate and the residual nickel concentration (the temperature in gettering: 625° C.);

FIG. 20 shows the relation between crystallization rate and the residual nickel concentration (the temperature in gettering: 650° C.);

FIG. 21 shows nickel concentration distribution in semiconductor film by secondary ion composition analysis method;

FIG. 22 shows the energy density dependency of laser light of nickel concentration at a surface of semiconductor film;

FIG. 23 shows the energy dependency of laser light of Raman shift in semiconductor film;

DESCRIPTION OF THE PREFERRED EMBODIMENTS

First Embodiment Mode

Figure 2:
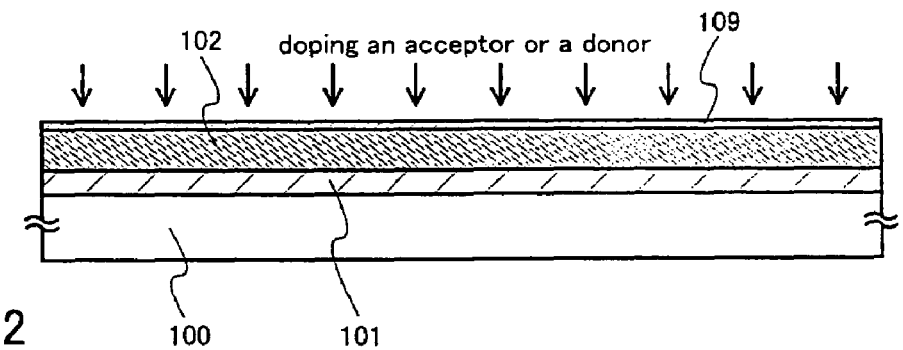
FIG. 2 is a cross sectional view illustrating a step for manufacturing the semiconductor device according to the present invention.

Embodiment modes of the present invention will be described in detail below with reference to the drawings. FIGS. 1A to 1F each illustrate a first embodiment mode of the present invention. In this embodiment mode, there is described a method with which gettering is performed after a metallic element having the catalytic action is added to the entire of a semiconductor film having an amorphous structure and crystallization is performed.

In FIG. 1A, there is no specific limitation on the material of a substrate 100, although it is preferable that barium borosilicate glass, aluminoborosilicate glass, or quartz is used. On a surface of the substrate 100, an inorganic insulating film having a thickness of 10 to 200 nm is formed as a blocking layer 101. A preferred example of the blocking layer is a combination of silicon oxynitride films produced with a plasma CVD method. The first silicon oxynitride film is formed using $SiH_4$, $NH_3$, and $N_2O$ to have a thickness of 50 nm and the second silicon oxynitride film is formed using $SiH_4$ and $N_2O$ to have a thickness of 100 nm. These silicon oxynitride films are applied as the blocking layer. The blocking layer 101 is provided to prevent an alkali metal contained in the glass substrate from diffusing through a semiconductor layer formed on the blocking layer. Also, it is possible to omit this block layer 101 in the case where a quartz substrate is used.

A semiconductor film (first semiconductor film) 102 having an amorphous structure is formed on the blocking layer 101 using a semiconductor material whose main ingredient is silicon. Typically, an amorphous silicon film, an amorphous silicon germanium film, or the like is formed to have a thickness of 10 to 100 nm with a plasma CVD method, a reduced pressure CVD method, or a sputtering method. In order to obtain a good-quality crystal, it is preferable that the concentration of impurities, such as oxygen and nitrogen, contained in the semiconductor layer 102 having the amorphous structure is reduced to $5\times10^{18}/cm^3$ or below. These impurities become a factor that hinders crystallization of the amorphous semiconductor and also become a factor that increases the densities of a trapping center and a recombination center even after the crystallization. Therefore, in addition to the use of a material gas of high purity, it is preferable to use an ultra-high vacuum CVD apparatus including a reaction chamber, whose inside surface has been subjected to mirror-surface process (electrolytic polishing treatment), or an oil-free vacuum exhaustion system.

Following this, a metallic element having the catalytic action that promotes crystallization is added to the surface of the semiconductor film 102 having the amorphous structure. As the metallic element having the catalytic action that promotes crystallization of the semiconductor film, there may be used one type or a plurality of types selected from the group consisting of iron (Fe), nickel (Ni), cobalt (Co), ruthenium (Ru). rhodium (Rh), palladium (Pd), osmium (Os), iridium (Ir), platinum (Pt), copper (Cu), and gold (Au). Typically, nickel is used and a nickel acetate solution, which contains 1 to 100 ppm nickel on a weight basis, is applied using a spinner to form a catalyst containing layer 103. In this case, as a surface treatment of the semiconductor film 102 having the amorphous structure to improve compatibility with the solution, an ultra-thin oxide film is formed using an ozone containing aqueous solution, a clean surface is formed by etching the oxide film using a mixed solution of hydrofluoric acid and a hydrogen peroxide solution, and the resultant film is processed again using the ozone containing aqueous solution. The surface of a semiconductor film, such as silicon, is originally hydrophobic. Therefore, it becomes possible to evenly apply the nickel acetate solution by forming the oxide film in this manner.

Needless to say, the method of forming the catalyst containing layer 103 is not limited to this and a sputtering method, an evaporation method, or a plasma process may be instead used. Also, the catalyst containing layer 103 may be formed before the semiconductor film 102 having the amorphous structure is formed, that is, may be formed on the blocking layer 101.

A heating process for crystallization is performed by maintaining a condition where the semiconductor film 102 having the amorphous structure contacts the catalyst containing layer 103. As a method of performing the heating process, there is employed the furnace annealing method using an electric heating furnace, the LRTA method using a halogen lamp, a metal halide lamp, a xenon arc lamp, a carbon arc lamp a high pressure sodium lamp, a high pressure mercury lamp, or the like, or GRTA method using gas as the heating medium. It is considered that the LRTA method or GRTA method is preferably adopted with consideration given to productivity.

In the case where the heating process is performed with the LRTA method, a lamp light source for heating is lit up for 1 to 60 seconds, preferably for 30 to 60 seconds. This operation is repeated once to 10 times, preferably twice to 6 times. The intensity of light emitted from the lamp light source is arbitrary set, although it is required that the semiconductor film is momentarily heated to 600 to 1000° C., preferably to around 650 to 750° C. Although being heated to such a high temperature, the semiconductor film is heated only for the very short time period and there occurs no distortion and deformation of the substrate 100. The semiconductor film having the amorphous structure is crystallized in this manner and it becomes possible to obtain a semiconductor film (first semiconductor film) 104 having a crystal structure shown in FIG. 1B. However, it is impossible to conduct crystallization in this manner without providing the catalyst containing layer.

In the case where the furnace annealing method is instead used, prior to the heating process, another heating process is performed at 500° C. for around one hour in order to release hydrogen contained in the semiconductor film 102 having the amorphous structure to the outside. Then, crystallization is performed by performing the heating process using an electric heating furnace in a nitrogen atmosphere at 550 to 600° C., preferably at 580° C., for four hours. In this manner, there is formed the semiconductor film (first semiconductor film) 104 having the crystal structure shown in FIG. 1B.

In order to further increase the crystallization rate (the proportion of crystal components in the entire volume or the entire area of the film) and to repair defects remaining in crystal grains, it is also effective to irradiate continuous-oscillation or pulse-oscillation laser light onto the semiconductor film 104 having the crystal structure, as shown in FIG. 1C. As the laser, there is used excimer laser whose wavelength is 400 nm or less or the second harmonic or the third harmonic of a YAG laser, a $YVO_4$ laser a $YAlO_3$ laser, or a YLF laser that are each a solid-state laser. The continuous-oscillation laser light is irradiated by condensing the second harmonic or the third harmonic of the stated solid-state laser in a linear manner or in an ellipse manner.

In the case where the continuous-oscillation $YVO_4$ laser is used, conversion into the second harmonic is performed by a wavelength conversion element and a beam with energy of 10 W is scanned at a speed of 1 to 100 cm/sec, thereby performing crystallization.

In the case of pulse-oscillation excimer laser, a pulse laser light having a repetition frequency of around 10 to 1000 Hz is used, the laser light is condensed to 100 to 400 mJ/cm$^2$ by an optical system, and a laser process is performed for the semiconductor film 104 having the crystal structure while maintaining an overlap ratio of 90 to 95%.

In a semiconductor film (first semiconductor film) 105 having the crystal structure obtained in this manner, there remains the catalytic element (nickel, in this embodiment mode). This catalytic element is not evenly distributed in the film, although the average concentration of the remaining element exceeds $1 \times 10^{19}/cm^3$. Needless to say, it is possible to form various kinds of semiconductor devices, such as a TFT, even under this condition. However, this remaining element is removed by performing gettering with a method described below.

First, as shown in FIG. 1D, a thin barrier layer 106 is formed on the surface of the semiconductor film 105 having the crystal structure. There is no specific limitation on the thickness of this barrier layer, although a chemical oxide formed through a process using ozone water may be used as a substitute as a matter of convenience. Also, it is possible to similarly form the chemical oxide through a process using an aqueous solution in which hydrogen peroxide solution is mixed with sulfuric acid, hydrochloric acid, nitric acid or the like. As a still another method, there may be performed a plasma process in an oxidation atmosphere. Further, an oxidation process may be instead performed by generating ozone through the irradiation with ultraviolet rays in an oxygen containing atmosphere. Also, a thin oxide film may be formed through heating to around 200 to 350° C. using a clean oven and this film may be used as the barrier layer. Alternatively, an oxide film having a thickness of around 1 to 5 nm may be deposited with a plasma CVD method, a sputtering method, or an evaporation method and this film may be used as the barrier layer.

On the barrier layer 106, a semiconductor film (second semiconductor film) 107 is formed with a plasma CVD method or a high-frequency sputtering method to have a thickness of 25 to 250 nm. Typically, an amorphous silicon film is selected. This semiconductor film 107 is to be removed afterward, so that it is preferable that this film is formed as a film having a low density in order to enhance the etching selectivity with the semiconductor film 105 having the crystal structure. For instance, in the case where an amorphous silicon film is formed with the plasma CVD method, the substrate temperature is maintained at around 100 to 200° C. and hydrogen is added so that 25 to 40 atom % hydrogen is contained in the film. In the case where the sputtering method is employed, in a like manner, the substrate temperature is set at 200° C. or below and sputtering is performed using a mixed gas of argon and hydrogen, thereby allowing a large quantity of hydrogen to be contained in the film. Also, if a rare gas element is added during the formation of this film with a sputtering method or a plasma CVD method, it becomes possible to allow the rare gas element to be simultaneously contained in the film. It is possible to form a gettering site even with the rare gas element contained in this manner.

Following this, with an ion doping method or an ion implantation method, addition is performed so that the rare gas element is contained in the semiconductor film 107 at a concentration of $1 \times 10^{20}$ to $2.5 \times 10^{22}/cm^3$. The acceleration voltage is arbitrarily set because there is no problem even if ions of rare gas that is injected as the rare gas element passes through the semiconductor film 107 and the barrier layer 106 and some of the ions reach the semiconductor film 105 having the crystal structure. The rare gas element itself is inactive in the semiconductor film, so that even if a region containing the rare gas element at a concentration of around $1 \times 10^{13}$ to $1 \times 10^{20}/cm^3$ exists in the vicinity of the surface of the semiconductor film 105, this has little effect on device characteristics.

As the rare gas element, there is used one type or a plurality of types selected from the group consisting of helium (He), neon (Ne), argon (Ar), krypton (Kr), and xenon (Xe). The present invention is characterized in that these rare gas elements are used as an ion source to form a gettering site and are implanted into the semiconductor film with an ion doping method or an ion implantation method. Ions of these rare gas elements are implanted for two purposes. One of the purposes is that a dangling bond is formed by this implantation and strains are given to the semiconductor film. The other of the purposes is that strains are given through the implantation of the ions between lattices of the semiconductor film. The implantation of ions of an inert gas satisfies both of these purposes at the same time. In particular, the latter purpose is strikingly accomplished when using an element, such as argon (Ar), krypton (Kr), or xenon (Xe), whose atomic radius is larger than that of silicon.

To accomplish gettering with reliability, it is required to perform a heating process afterward. This heating process is performed with a furnace annealing method, an LRTA method, or GRTA method. If the heating process is performed with the furnace annealing method, the heating process is performed at 450 to 600° C. for 0.5 to 12 hours in a nitrogen atmosphere. Also, in the case where the LRTA method is used, a lamp light source for heating is lit up for 1 to 60 seconds, preferably for 30 to 60 seconds. This operation is repeated 1 to 10 times, preferably 2 to 6 times. The intensity of light emitted from the lamp light source is arbitrarily set, although it is required that the semiconductor film is momentarily heated to 600 to 1000° C., preferably to around 700 to 750° C.

During the gettering, the catalytic element existing in the gettering target region (trapping site) is emitted due to thermal energy and moves to a gettering site through diffusion. Accordingly, the gettering depends on a process temperature, and the time taken to perform the gettering is shortened in accordance with the increase in the process temperature. As indicated by the arrows in FIG. 1E, the distance, by which the catalytic element moves, is around the thickness of the semiconductor film, so that the gettering is completed within a relatively short time period.

It should be noted here that the semiconductor film 107 containing the rare gas element at a concentration of $1 \times 10^{20}/cm^3$ or higher is not crystallized by this heating process. This may be because the rare gas element is not reemitted and remains in the film even within the process temperature range described above and the crystallization of the semiconductor film is hindered by this remaining rare gas element.

Following this, the amorphous semiconductor 107 is selectively etched and removed. As a method of performing this etching, there may be performed dry etching, which is performed with ClF$_3$ without using plasma, or wet etching that is performed with an alkali solution such as an aqueous solution containing hydrazine or tetraethylammonium hydroxide (chemical formula is (CH$_3$)$_4$NOH). At this time, the barrier layer 106 functions as an etching stopper. Also, there occurs no problem by removing the barrier layer 106 using hydrofluoric acid afterward.

In this manner, as shown in FIG. 1F, there is obtained a semiconductor film 108 having a crystal structure in which the concentration of the catalytic element is reduced to $1 \times 10^{17}/cm^3$ or lower. The semiconductor film 108 having the crystal structure formed in this manner is formed as a crystal having a narrow bar shape or a narrow and flat bar shape by the action of the catalytic element, and each of crystals grows in a specific direction from a macroscopic viewpoint. The semiconductor film 108 having such a crystal structure may be applied as a photoelectric conversion layer of a photosensor or a solar cell as well as an active layer of a TFT.

Second Embodiment Mode

FIGS. 11A to 11E each illustrate a second embodiment mode of the present invention. In this embodiment mode, there is described a method of improving crystallinity by performing gettering and further performing irradiation of strong light, such as laser light, after a semiconductor film having a crystal structure is formed through a heating process. Note that in FIGS. 11A to 11E, there are used the same reference numerals as in FIGS. 1A to 1F that were referred to in the first embodiment mode.

Figure 11A:
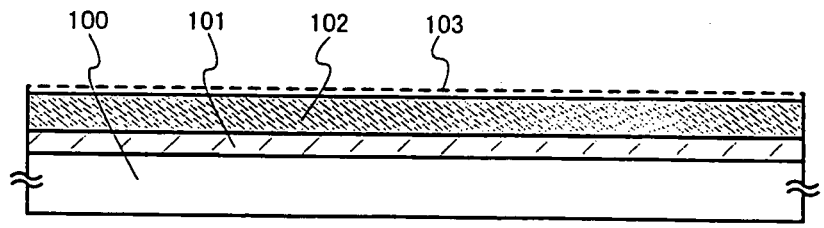
FIGS. 11A to 11E are each a cross sectional view illustrating a step for manufacturing the semiconductor device according to the present invention.
Figure 11B:
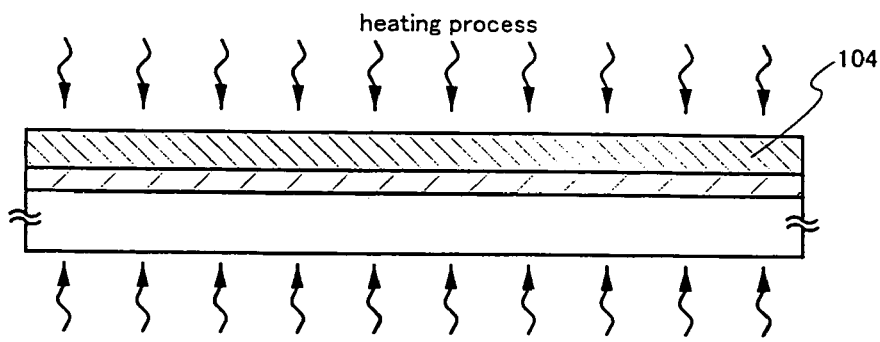

Each of FIGS. 11A and 11B shows the same step as in the first embodiment mode and, after the blocking layer 101, the semiconductor film 102 having the amorphous structure, and the layer 103 containing a catalytic element are formed on the substrate 100, the semiconductor film 104 having the crystal structure is formed through a heating process.

Figure 11C:
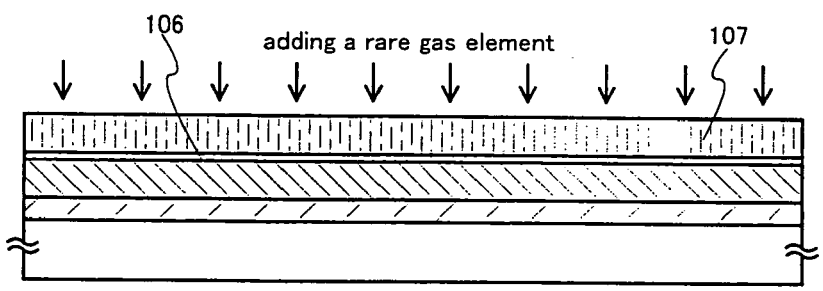

Following this, as shown in FIG. 11C, the barrier layer 106 is formed on the surface of the semiconductor film (first semiconductor film) 104 having the crystal structure, and further the semiconductor film 107 is formed thereon. A rare gas element is added to this semiconductor film 107 with an ion implantation method or an ion doping method so that the rare gas element is contained at a concentration of $1 \times 10^{20}$ to $2.5 \times 10^{22}/cm^3$.

Figure 11D:
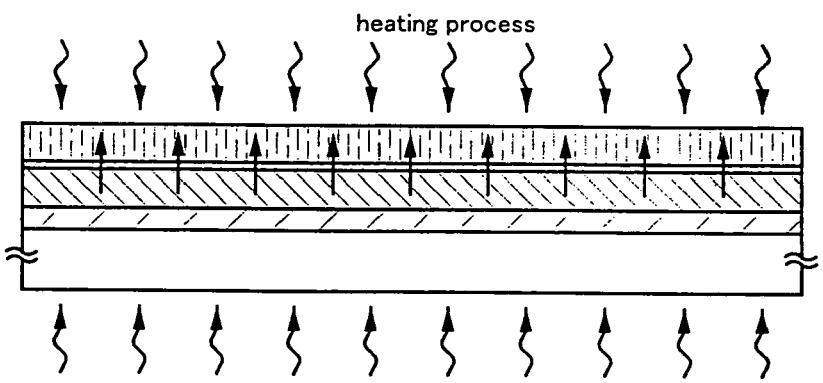

Then, as shown in FIG. 11D, a heating process is performed with a furnace annealing method, the LRTA method, or the GRTA method. In the case where the heating process is performed with the furnace annealing method, the heating process is performed at 450 to 600° C. for 0.5 to 12 hours in a nitrogen atmosphere. Also, in the case where the LRTA method is used, a lamp light source for heating is lit up for 1 to 60 seconds, preferably for 30 to 60 seconds. This operation is repeated 1 to 10 times, preferably 2 to 6 times. The intensity of light emitted from the lamp light source is arbitrarily set, although it is required that the semiconductor film is momentarily heated to 600 to 1000° C., preferably to around 700 to 750° C. It is also possible to perform the gettering through the irradiation of the second harmonic (wavelength is 532 nm) of a YAG laser, a YLF laser, or a YVO$_4$ laser of a continuous oscillation type or a pulse oscillation type. During the gettering, a catalytic element existing in a trapping site is emitted due to thermal energy and moves to a gettering site through diffusion. Accordingly, the gettering depends on a process temperature, and the time taken to perform the gettering is shortened in accordance with the increase of the process temperature. As indicated by the arrows in FIG. 1D, the distance, by which the catalytic element moves, is around the thickness of the semiconductor film, so that the gettering is completed within a relatively short time period.

It should be noted here that the semiconductor film (second semiconductor film) 107 containing the rare gas element at a concentration of $1 \times 10^{20}/cm^3$ or higher is not crystallized by this heating process. This may be because the rare gas element is not reemitted and remains in the film even within the process temperature range described above and the crystallization of the semiconductor film is hindered by this remaining rare gas element.

Following this, the semiconductor film 107 is selectively etched and removed. As a method of performing this etching, there may be performed dry etching, which is performed with ClF$_3$ without using plasma, or wet etching that is performed with an alkali solution such as an aqueous solution containing hydrazine or tetraethylammonium hydroxide (chemical formula is (CH$_3$)$_4$NOH). At this time, the barrier layer 106 functions as an etching stopper. Also, there occurs no problem by removing the barrier layer 106 using hydrofluoric acid afterward.

Figure 11E:
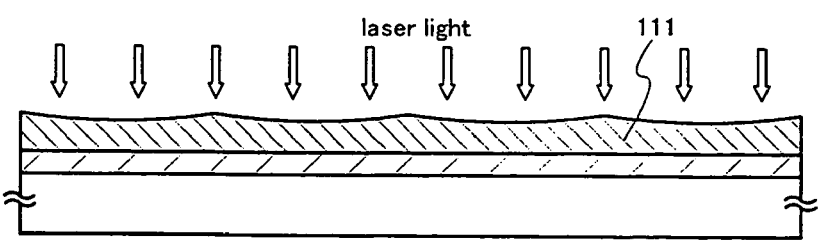

In order to further increase the crystallization rate (the proportion of crystal components in the entire volume of the film) and to repair defects remaining in crystal grains, it is also effective to irradiate laser light onto the semiconductor film 104 having the crystal structure, as shown in FIG. 11E. As the laser, there is used excimer laser light whose wavelength is 400 nm or below or the second harmonic or the third harmonic of a YAG laser. At all events, there is used pulse laser light whose repetition frequency is around 10 to 1000 Hz. This laser light is condensed to 100 to 400 mJ/cm$^2$ by an optical system and is irradiated so that an overlap ratio of 90 to 95% is maintained. In this manner, there is formed a semiconductor film 111 having a crystal structure.

Third Embodiment Mode

FIG. 14 illustrates a third embodiment mode of the present invention. In this embodiment mode, there is described a method of simultaneously performing (1) crystallization by adding a metallic element having the catalytic action to the entire of a semiconductor film having an amorphous structure and (2) gettering.

Figure 14A:
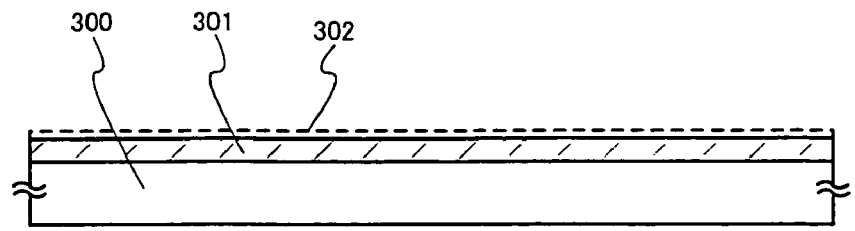
FIGS. 14A to 14E are each a cross sectional view illustrating a step for manufacturing the semiconductor device according to the present invention.

First, as shown in FIG. 14A, a catalytic element containing layer 302 is formed on a blocking layer 301. At this time, an aqueous solution or an alcohol fluid containing a catalytic element may be applied with a spinner. Alternatively, the catalytic element containing layer 302 may be formed with a sputtering method an evaporation method, a plasma process, or the like.

Figure 14B:
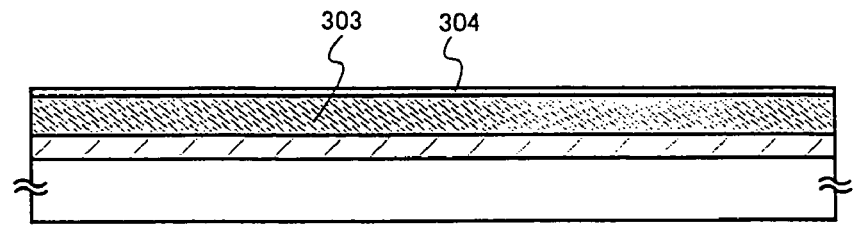

Following this, as shown in FIG. 14B, a semiconductor film (first semiconductor film) 303 having an amorphous structure is formed to have a thickness of 10 to 100 nm with a plasma CVD method, a reduced pressure CVD method, or a sputtering method, and a barrier layer 304 is further formed thereon. The methods of forming these film and layer are the same as those in the first embodiment mode.

Figure 14C:
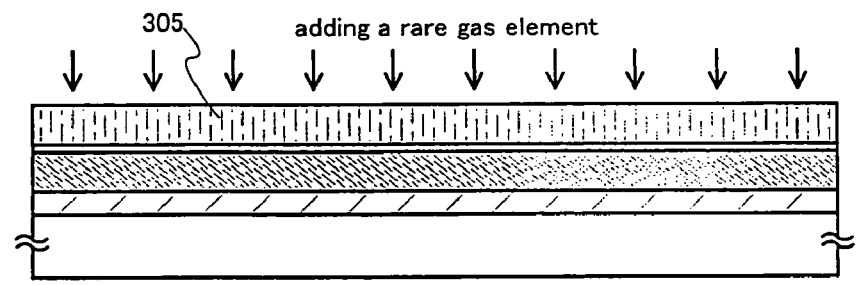

As shown in FIG. 14C, a semiconductor film (second semiconductor film) 305 is formed thereon to have a thickness of 25 to 250 nm with a plasma CVD method or a sputtering method. Typically, an amorphous silicon film is selected. This semiconductor film 305 is to be removed afterward, so that it is preferable that this film is formed to have a low density.

Following this, with an ion doping method or an ion implantation method, addition is performed so that a rare gas element is contained in the semiconductor film 305 at a concentration of $1 \times 10^{20}$ to $2.5 \times 10^{22}/cm^3$. The acceleration voltage is arbitrarily set because there occurs no problem even if ions of rare gas that is injected as the rare gas element passes through the semiconductor film 305 and the barrier layer 304 and some of the ions reach the semiconductor film 303 having the amorphous structure. The rare gas element itself is inactive in the semiconductor film, so that even if a region containing the rare gas element at a concentration of around $1 \times 10^{18}$ to $1 \times 10^{20}/cm^3$ exists in the vicinity of the surface of the semiconductor film 303, this has little effect on device characteristics.

Figure 14D:
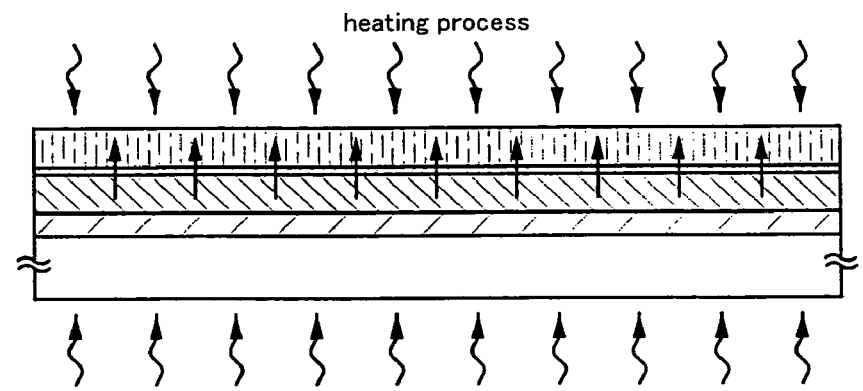

Then, as shown in FIG. 14D, a heating process is performed. As a method of performing the heating process, there is employed a furnace annealing method using an electric heating furnace, the LRTA method using a halogen lamp, a metal halide lamp, a xenon arc lamp, a carbon arc lamp, a high pressure sodium lamp, a high pressure mercury lamp, or the like, or the GRTA method using Ar, nitrogen, or the like, as the heating medium.

In the case where the heating process is performed with the LRTA method, a lamp light source for heating is lit up for one to 60 seconds, preferably for 30 to 60 seconds. This operation is repeated once to ten times, preferably twice to six times. The intensity of light emitted from the lamp light source is arbitrarily set, although it is required that the semiconductor film is momentarily heated to 600 to 1000° C., preferably to around 650 to 750° C. Even if being heated to such a high temperature, the semiconductor films are heated only for a very short time period and there occurs no distortion and deformation of the substrate 100. In the case where the furnace annealing method is instead used, prior to the heating process, another heating process is performed at 500° C. for around one hour, thereby releasing hydrogen contained in the semiconductor film 303 having the amorphous structure. Then, crystallization is performed by performing a heating process using an electric heating furnace in a nitrogen atmosphere at 550 to 600° C., preferably at 580° C., for four hours.

As a result of this heating process, the catalytic element seeps to the semiconductor film 303 having the amorphous structure and is diffused toward the semiconductor film 305 (in the direction indicated by the arrows 307 in FIG. 14D) while crystallizing the semiconductor film. As a result, crystallization and gettering are performed at the same time by performing a heating process only once.

Following this, the semiconductor film 305 is selectively etched and removed. As a method of performing this etching, there may be performed dry etching, which is performed with $ClF_3$ without using plasma, or wet etching that is performed with an alkali solution such as an aqueous solution containing hydrazine or tetraethylammonium hydroxide (chemical formula is $(CH_3)_4NOH$). At this time, the barrier layer 304 functions as an etching stopper. Also, there occurs no problem by removing the barrier layer 304 using hydrofluoric acid afterward.

Figure 14E:
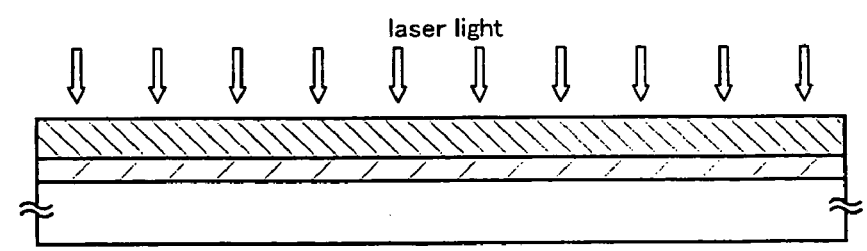

In this manner, as shown in FIG. 14E, there is obtained a semiconductor film (first semiconductor film) 306 having a crystal structure in which the concentration of the catalytic element is reduced to $1 \times 10^{17}/cm^3$ or below. In order to enhance the crystallinity of the semiconductor film 306 having this crystal structure, irradiation of laser light may be performed like in the first embodiment mode.

The semiconductor film 306 having the crystal structure formed in this manner is formed as a crystal having a narrow bar shape or a narrow and flat bar shape by the action of the catalytic element, and each of crystals grows in a specific direction from a macroscopic viewpoint. The semiconductor film 306 having such a crystal structure may be applied as a photoelectric conversion layer of a photosensor or a solar cell as well as an active layer of a TFT.

Fourth Embodiment Mode

In the first or second embodiment mode, the step after the formation of the blocking layer and the semiconductor film 102 having the amorphous structure on the substrate 101 may be performed in the manner shown in FIG. 2. A thin barrier layer 109 is formed on the surface of the semiconductor film 102 having the amorphous structure and an acceptor or a donor is added with an ion doping method or an ion implantation method at a concentration level of around $1 \times 10^{16}$ to $1 \times 10^{18}/cm^3$. This construction is aimed at performing valence electron control of a semiconductor film obtained after the crystallization of the semiconductor film 102 having the amorphous structure, and is applicable, for instance, to a case where the threshold voltage of a TFT is controlled.

Following this, like in the first or second embodiment mode, a semiconductor film having a crystal structure is formed. Alternatively, like in the third embodiment mode, the steps following the step shown in FIG. 14B are performed and a semiconductor film having a crystal structure is formed.

Fifth Embodiment Mode

Figure 3:
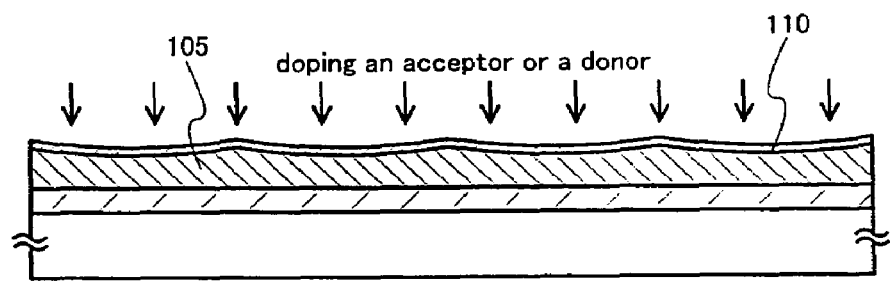
FIG. 3 is a cross sectional view illustrating a step for manufacturing the semiconductor device according to the present invention.

In one of the first to third embodiment modes, as shown in FIG. 3, after a semiconductor film having a crystal structure is formed, an acceptor or a donor may be added with an ion doping method or an ion implantation method at a concentration level of around $1 \times 10^{16}$ to $1 \times 10^{18}/cm^3$. This construction is aimed at performing valence electron control of the semiconductor film having the crystal structure and is applicable to a case where the threshold voltage of a TFT is controlled, like in the fourth embodiment mode.

An impurity element of one conduction type added in this embodiment mode is activated by a heating process at 400 to 600° C. and it is possible to have this impurity element function as an acceptor or a donor.

EMBODIMENTS

First Embodiment

There will be described an example of a method of simultaneously producing, on the same substrate, a pixel portion and TFTs (an n-channel type TFT and a p-channel type TFT), which is a driving circuit provided on the periphery of the pixel portion, with the technique of the present invention. The following description will be made with reference to FIGS. 4A and 4B, 5A to 5C, 6A and 6B, 7A and 7B, 8, and 10.

In FIG. 4A, it is possible to use a glass substrate, a quartz substrate, a ceramic substrate, or the like as a substrate 201. Also, the substrate 201 may be produced by forming an insulating film on the surface of a silicon substrate, a metallic substrate, or a stainless substrate. In the case where a glass substrate is used, a glass substrate having a thickness of 0.5 to 1.1 mm is employed, although it is required to reduce the thickness for weight reduction. Also, to achieve further weight reduction, it is preferable to employ a glass substrate having a small gravity such as 2.37 g/cc.

Then, as shown in FIG. 4A, a blocking layer 202 composed of an insulating film, such as a silicon oxide film, a silicon nitride film, or a silicon oxynitride film ($SiO_xN_y$), is formed on the substrate 201. As a representative example of the blocking layer 202, there is employed a two-layered structure where the first silicon oxynitride film 202a is formed to have a thickness of 50 to 100 nm using $SiH_4$, $NH_3$, and $N_2O$ as reaction gases, and the second silicon oxynitride film 202b is formed and stacked on the film 202a to have a thickness of 100 to 150 nm using $SiH_4$ and $N_2O$ as reaction gases.

The semiconductor film having the crystal structure produced in one of the first to fifth embodiment modes is used as a semiconductor film functioning as an active layer. This semiconductor film is divided to obtain island-like semiconductor films 203 to 206. The thickness of these semiconductor films is set at 20 to 100 nm, preferably at 30 to 60 nm.

Next, there is formed a gate insulating film 207 that covers the island-like semiconductor layers 203 to 206 that are separated from each other. The gate insulating film 207 is formed with a plasma CVD method or a sputtering method. This gate insulating film 207 has a thickness of 40 to 150 nm and is formed using an insulating film that contains silicon. Needless to say, it is possible to use an insulating film, which contains silicon and has a monolayered structure or a multilayered structure, as this gate insulating film. In the case where silicon oxide film is used, it is possible to form the gate insulating film 207 by mixing TEOS (tetraethyl ortho silicate) with $O_2$ using a plasma CVD method and by performing discharge under a condition where the reaction pressure is set at 40 Pa, the substrate temperature is set at 300 to 400° C., and the high-frequency (13.56 MHz) power density is set at 0.5 to 0.8 W/cm$^2$. It is possible that the silicon oxide film produced in this manner obtains excellent characteristics as a gate insulating film through thermal annealing performed at 400 to 500° C. after the formation.

On the gate insulating film 207, there are formed and laminated a tantalum nitride film (TaN) 208 as the first conductive film having a thickness of 20 to 100 nm and a tungsten film (W) 209 as the second conductive film having a thickness of 100 to 400 nm. The conductive material used to form gate electrodes is an element selected from the group consisting of Ta, W, Ti, Mo, Al, and Cu. Alternatively, the gate electrodes are formed using an alloy material or a compound material in which one of the above elements is comprised as the main ingredient. Also, there may be used a semiconductor film represented by a polycrystalline silicon film doped with an impurity element such as phosphorus. Further, there may be used a combination where the first conductive film is formed using a tantalum (Ta) film and a W film is used as the second conductive film. Also, there may be used a combination where the first conductive film is formed using a tantalum nitride (TaN) film and an Al film is used as the second conductive film. Further, there may be used a combination where the first conductive film is formed using a tantalum nitride (TaN) film and a Cu film is used as the second conductive film.

Next, as shown in FIG. 4B, a mask 210 made of a resist is formed in a light exposure step and the first etching process is performed to form gate electrodes and wirings. To perform the etching, it is preferable to use an ICP (inductively coupled plasma) etching method. There is no limitation on an etching gas used, although it is suitable that $CF_4$, $Cl_2$, and $O_2$ are used for the etching of W or TaN. The gas flow rate ratio of these gases is set at 25/25/10 (SCCM), and RF (13.56 MHz) power of 500 W is applied to a coil-type electrode under a pressure of 1 Pa. In this manner, plasma is generated and etching is performed. Also, RF (13.56 MHz) power of 150 W is applied to the substrate side (sample stage), thereby applying a substantially negative self-bias voltage. Under this first etching condition, the W film is etched and an edge portion of the first conductive layer is processed to have a tapered shape.

Following this, the first etching condition is switched to the second etching condition. Under the second etching condition, $CF_4$ and $Cl_2$ are used as an etching gas the gas flow rate ratio of these gases is set at 30/30 (SCCM), and RF (13.56 MHz) power of 500 W is applied to a coil-type electrode under a pressure of 1 Pa. In this manner, plasma is generated and etching is performed for around 30 seconds. There is also applied RF (13.56 MHz) power of 20 W to the substrate side (sample stage), thereby applying a substantially negative self-bias voltage. Under the second etching condition where $CF_4$ and $Cl_2$ are mixed with each other, both of the W film and the TaN film are etched to the same degree. Note that in order to perform the etching without leaving residues on the gate insulating film, it is preferable that the time taken by the etching is increased by around 10 to 20%.

During this first etching process, by appropriately selecting the shape of the mask made of a resist, a tapered shape is given to edge portions of the first conductive layer and the second conductive layer because of the effect of the bias voltage applied to the substrate side. As a result of this first etching process, there are formed the first-shaped conductive layers 211 to 215 (the first conductive layers 211a to 215a and the second conductive layers 211b to 215b) composed of the first conductive layer and the second conductive layer. As to the gate insulating film, regions which are not covered with the first-shaped conductive layers 211 to 215 are etched by around 20 to 50 nm and therefore the thickness thereof is reduced.

Then, the first n-type semiconductor regions are formed using the first-shaped conductive layers as a mask. The condition regarding an ion doping method used during the first doping process for forming these regions is that the dosage is set at $5 \times 10^{14}$ to $5 \times 10^{15}$/cm$^2$ (typically, $1 \times 10^{15}$/cm$^2$) and the acceleration voltage is set at 60 to 100 keV. Under this condition, phosphorous is doped. In this example, impurity regions are formed in each semiconductor layer by utilizing the difference in film thickness between the first-shaped conductive layers 211 to 215 and the gate insulating film. In this manner, there are formed the first n-type semiconductor regions 216 to 219. Phosphorous is added to these first n-type semiconductor regions at a concentration of $1 \times 10^{20}$ to $1 \times 10^{21}$/cm$^3$.

Next, as shown in FIG. 5A, the second etching process is performed without removing the mask 210 made of a resist. There are used $CF_4$, $Cl_2$, and $O_2$ as an etching gas, the gas flow rate ratio of these gases is set at 20/20/20 (SCCM), and RF (13.56 MHz) power of 500 W is applied to a coil-type electrode under a pressure of 1 Pa. In this manner, plasma is generated and etching is performed. There is applied RF (13.56 MHz) power of 20 W to the substrate side (sample stage), thereby applying a low self-bias voltage in comparison with the first etching process. Under this third etching condition, the W film is etched. In this manner, the W film is subjected to anisotropic etching and the second-shaped conductive layers 220 to 224 (the first conductive layers 220a to 224a and the second conductive layers 220b to 224b) are formed. The gate insulating film that is not covered with the second-shaped conductive layers 220 to 224 is further etched by around 20 to 50 nm and the thickness thereof is reduced.

Then, the second doping process is performed without removing the mask made of a resist, thereby adding phosphorous to the semiconductor film as a donor. It is possible to perform this doping process with an ion doping method or an ion implantation method. The ion doping method is performed under a condition where the dosage is set at $1.5 \times 10^{14}$/cm$^2$ and the acceleration voltage is set at 60 to 100 keV. In this case, the second-shaped conductive layers 220b to 223b function as a mask against phosphorous and the second n-type semiconductor regions 225 to 228 are formed in a self-align manner. An impurity element, such as phosphorous, belonging to Group 15 of the periodic table is added to these regions at a concentration of $1 \times 10^{16}$ to $1 \times 10^{18}$/cm$^3$.

Following this, a mask 229 is formed and the third etching process is performed. There are used $SF_6$ and $Cl_2$ as an etching gas. The gas flow rate ratio of these gases is set at 50/10 (SCCM) and RF (13.56 MHz) power of 500 W is applied to a coil-type electrode under a pressure of 1.3 Pa. In this manner, plasma is generated and etching is performed for around 30 seconds. There is applied RF (13.56 MHz) power of 10 W to the substrate side (sample stage), thereby applying a substantially negative self-bias voltage. In this manner, the second-shaped conductive layers 220a and 222a to 224a are etched under the third etching condition and the third-shaped conductive layers 230 to 233 (the first conductive layers 230a to 233a and the second conductive layers 230b to 233b) are formed.

Next, a mask 250 made of a resist is newly formed and the third doping process is performed, as shown in FIG. 5C. As a result of this third doping process, the first p-type semiconductor regions 234 and 235 are formed. The concentration of boron added to form the p-type semiconductor regions is set at $1 \times 10^{20}$ to $5 \times 10^{21}/cm^3$ that is 1.5 to three times as high as the concentration of the phosphorus added in the previous step.

As a result of these steps, n-type or p-type semiconductor regions are formed in each semiconductor layer. The second-shaped conductive layer 221 and the third-shaped conductive layers 230 and 231 function as gate electrodes. Also, the second-shaped conductive layer 232 functions as one of electrodes forming a storage capacitor in the pixel portion. Further, the third-shaped conductive layer 233 forms a data line in the pixel portion.

Next, the first interlayer insulating film 237 is formed so as to cover almost the entire surface. This first interlayer insulating film 237 is formed to have a thickness of 100 to 200 nm using a plasma CVD method or a sputtering method. One suitable example thereof is a silicon oxynitride film with a film thickness of 150 nm formed with a plasma CVD method. Needless to say, the first interlayer insulating film 237 is not limited to the silicon oxynitride film and there may be instead used an insulating film that contains another silicon and has a monolayered structure or a multilayered structure.

Following this, there is performed a step in which a process is performed so as to activate the impurity element added to each semiconductor layer. It is possible to perform this activation with the furnace annealing method, the LRTA method, the GRTA method, or the irradiation with laser light. In the case of the furnace annealing method, a heating process is performed at 400 to 700° C. (representatively, at 500° C.) for four hours in a nitrogen atmosphere using an electric heating furnace. In the case where the activation is performed by the irradiation with laser light, the second harmonic (532 nm) of a YAG laser is used and is irradiated from the substrate side. The reason why this irradiation is performed in this manner is to sufficiently activate the second n-type semiconductor region overlapping the second-shaped conductive layer 221. Needless to say, the same applies to the case of the LRTA method using a lamp light source and the semiconductor films are heated from both surfaces of the substrate or the substrate side by the radiation from the lamp light source.

Following this, as shown in FIG. 6B, the second interlayer insulating film 238 made of silicon nitride is formed with a plasma CVD method a heating process is performed at 410° C. using a clean oven, and hydrogenation of the semiconductor films is performed using hydrogen emitted from the silicon nitride film.

Figure 7A:
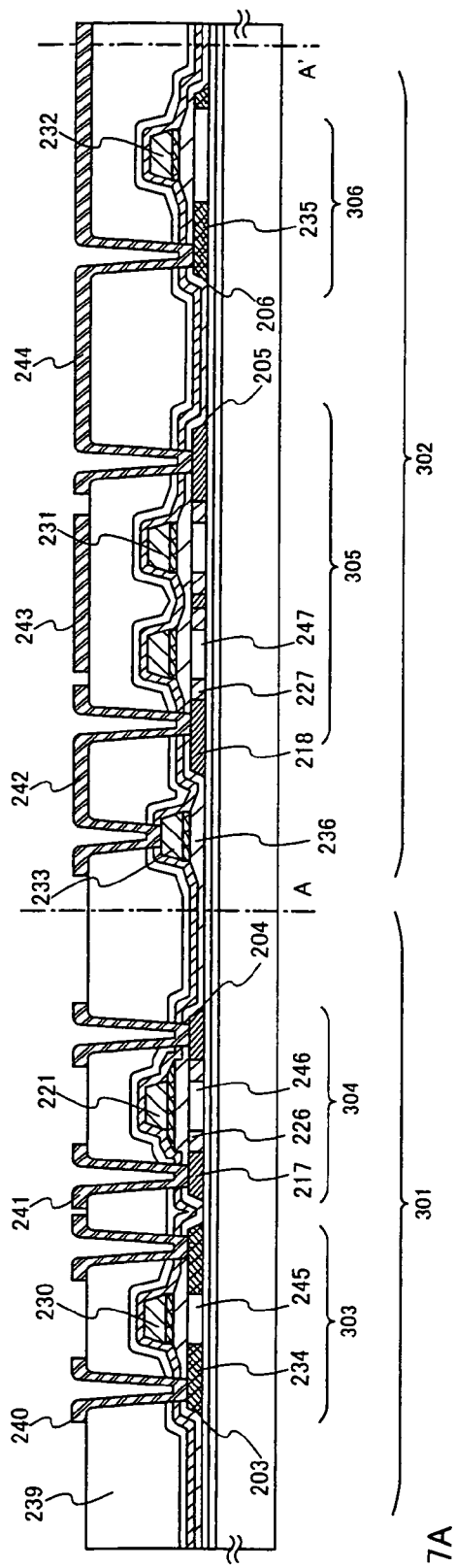
FIGS. 7A and 7B are each a cross sectional view illustrating steps for manufacturing the active matrix substrate that is produced with the technique of the present invention and is applicable to the reflection-type display apparatus.

Next, as shown in FIG. 7A, the third interlayer insulating film 239 made of an organic insulating material is formed on the second interlayer insulating film 238. Next, contact holes reaching the data line 224 and contact holes reaching respective impurity regions are formed. Following this, wirings and a pixel electrode are formed using Al, Ti, Mo, W, and the like. For instance, there is used a multilayered film including a Ti film having a thickness of 50 to 250 nm and an alloy film (an alloy film of Al and Ti) having a thickness of 300 to 500 nm.

In this manner, the source or drain wirings 240 and 241, a gate wiring 243, a connection wiring 242, and the pixel electrode 224 are formed.

In the manner described above, it is possible to form a driving circuit 301 composed of a p-channel type TFT 303 and an n-channel type TFT 304 and a pixel portion 302 composed of an n-channel type TFT 305 on the same substrate. The n-channel type TFT 305 has a multi-gate structure. Also, in the pixel portion 302, there is formed an storage capacitor 306 composed of the semiconductor film 206, an insulating film formed of the same layer with the gate insulating film 236, and the third-shaped conductive layer 232.

The p-channel type TFT 303 of the driving circuit 301 has a so-called single-rain structure where the first, p-type semiconductor region 234 (region functioning as a source region or a drain region) is formed outside of the third-shape conductive layer 230 forming a channel forming region 245 and a gate electrode. The n-channel type TFT 304 has a channel forming region 246, the second n-type semiconductor region 226 (LDD region) partially overlapping the second-shape conductive layer 221, and the first n-type semiconductor region 217 functioning as a source region or a drain region. This construction of the LDD region is mainly aimed at preventing the degradation of the TFT due to a hot carrier effect. It is possible to form a shift register circuit, a buffer circuit, a level shifter circuit, a latch circuit, and the like using such n-channel type TFTs and p-channel type TFT. In particular, the structure of the n-channel type TFT 304 is suitable for a buffer circuit, whose driving voltage is high, because the degradation due to a hot carrier effect is prevented with its construction.

The n-channel type TFT 305 in the pixel portion 302 includes a channel forming region 247, the second n-type semiconductor region 227 formed outside of the third-shaped conductive layer 231, and the first n-type semiconductor region 218 functioning as a source region or a drain region. Also, the first p-type semiconductor region 235 is formed for the semiconductor layer 206 functioning one of the electrodes of the storage capacitor 306.

In the pixel portion, reference numeral 244 denotes a pixel electrode and numeral 242 represents a connection wiring connecting the data line 233 to the first n-type semiconductor region of the semiconductor film 205. Also, numeral 243 indicates gate wiring that is connected (although not shown in the drawing) to the third-shaped conductive layer 231 functioning as a gate electrode.

Figure 7B:
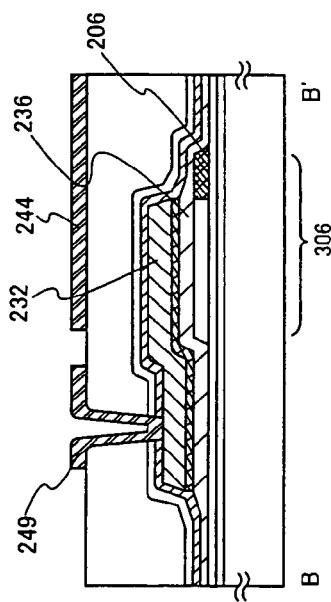

The structure of the storage capacitor 306 is shown in FIG. 7B, in which it is formed by the semiconductor film 206, the gate insulating film 236 and the capacitance electrode 232, and is connected to the gate wiring 249 of the adjacent pixels.

Figure 8:
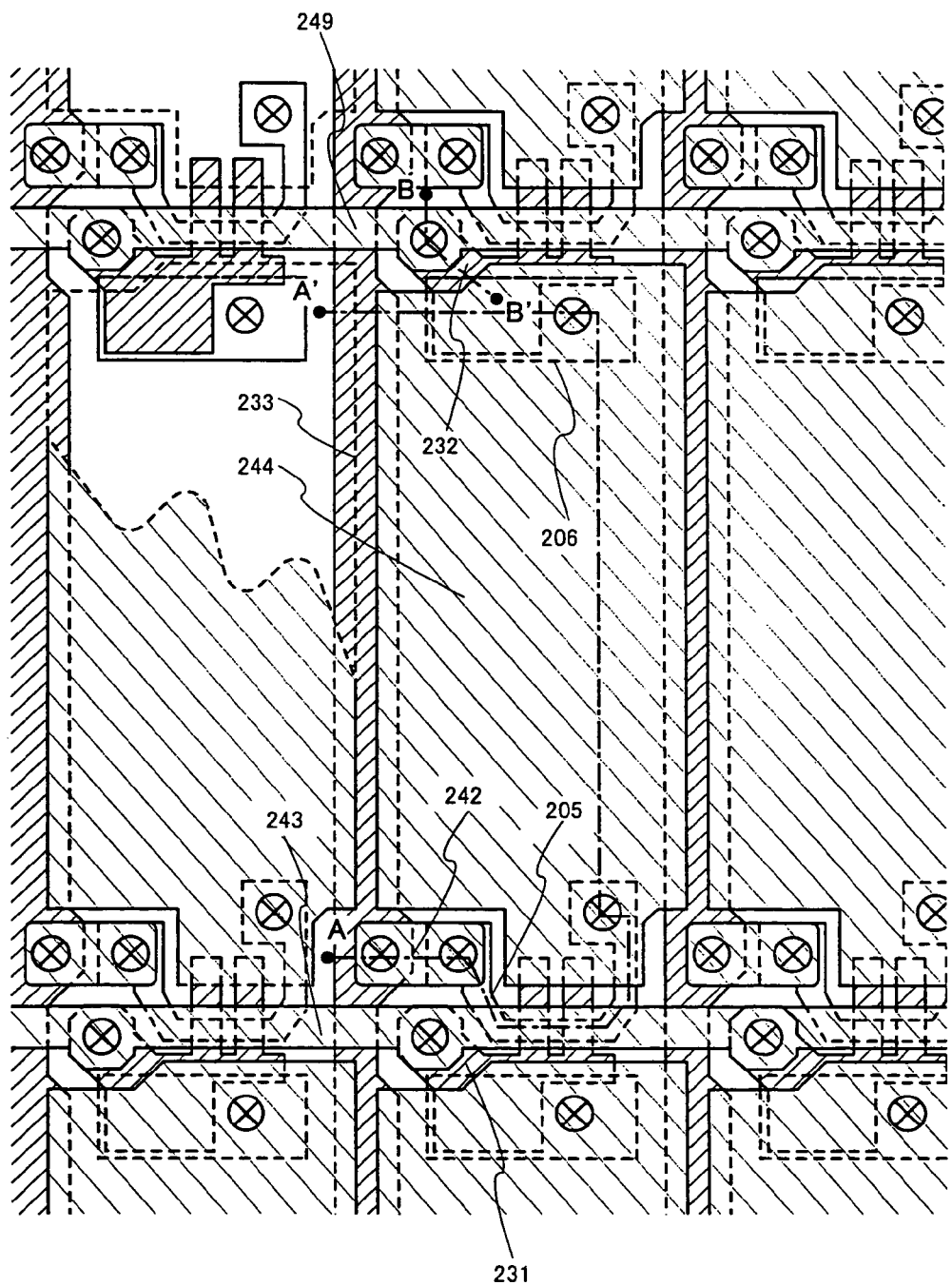
FIG. 8 is a top view illustrating the construction of a pixel portion of the active matrix substrate that is produced with the technique of the present invention and is applicable to the reflection-type display apparatus.

A top view of the pixel portion 302 having such a construction is shown in FIG. 8. In FIG. 8, there is shown a top view corresponding to approximately one pixel and the same reference numerals as in FIG. 7A are given. Also, a cross-sectional view taken along the line A-A' is shown in FIG. 7A, while a cross-sectional view taken along the line B-B' is shown in FIG. 7B. With the pixel structure shown in FIG. 8, the gates wiring and the gate electrodes are formed on different layers. This makes it possible to superimpose the gate wirings 243 on the semiconductor layers 205 and to give a function as a shading film to the gate wirings. Also, arrangement is made so that an edge portion of the pixel electrode 244 overlaps the data wiring 233 and spaces between pixel electrodes are shaded. In this manner, there is obtained a structure where it is possible to omit the formation of a shading film (a black matrix). As a result, it becomes possible to improve an aperture ratio in comparison with a conventional case.

Figure 10:
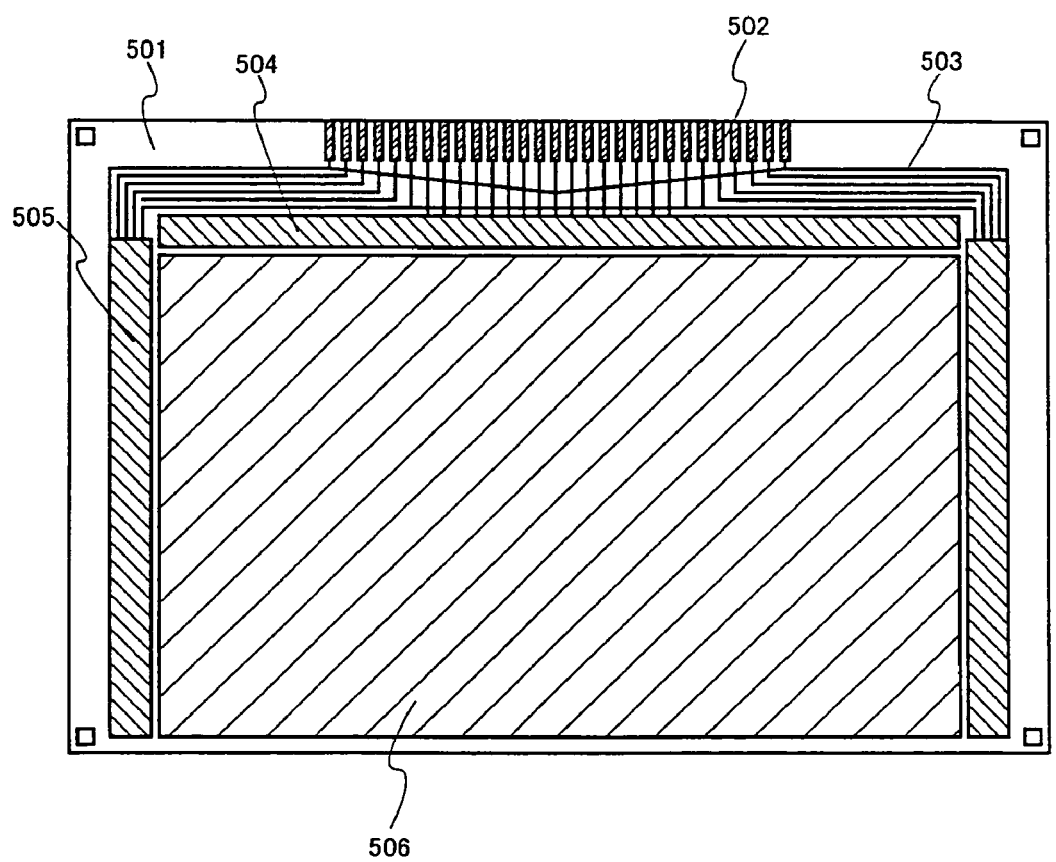
FIG. 10 is a top view illustrating the external appearance of the active matrix substrate.

For the sake of convenience, the substrate including the driving circuit 301 and the pixel portion 302 formed in this embodiment will be hereinafter referred to as the "active matrix substrate". It becomes possible to produce a display apparatus that performs active matrix driving using such an active matrix substrate. In this embodiment, the pixel electrode is made of a material having light reflectivity, so that it is possible to produce a display apparatus of a reflection type by applying the active matrix substrate to a liquid crystal display apparatus. It is possible to produce a liquid crystal display apparatus or a light-emitting apparatus, whose pixel portion is formed using organic light-emitting elements, using such a substrate. FIG. 10 is an external view of the active matrix substrate on which driving circuits and a pixel portion are formed using the TFTs. A pixel portion 506 and driving circuits 504 and 505 are formed on a substrate 501. Also, an input terminal 502 is formed in one edge portion of the substrate and wirings 503 connected to respective driving circuits are routed.

Second Embodiment

Figure 9:
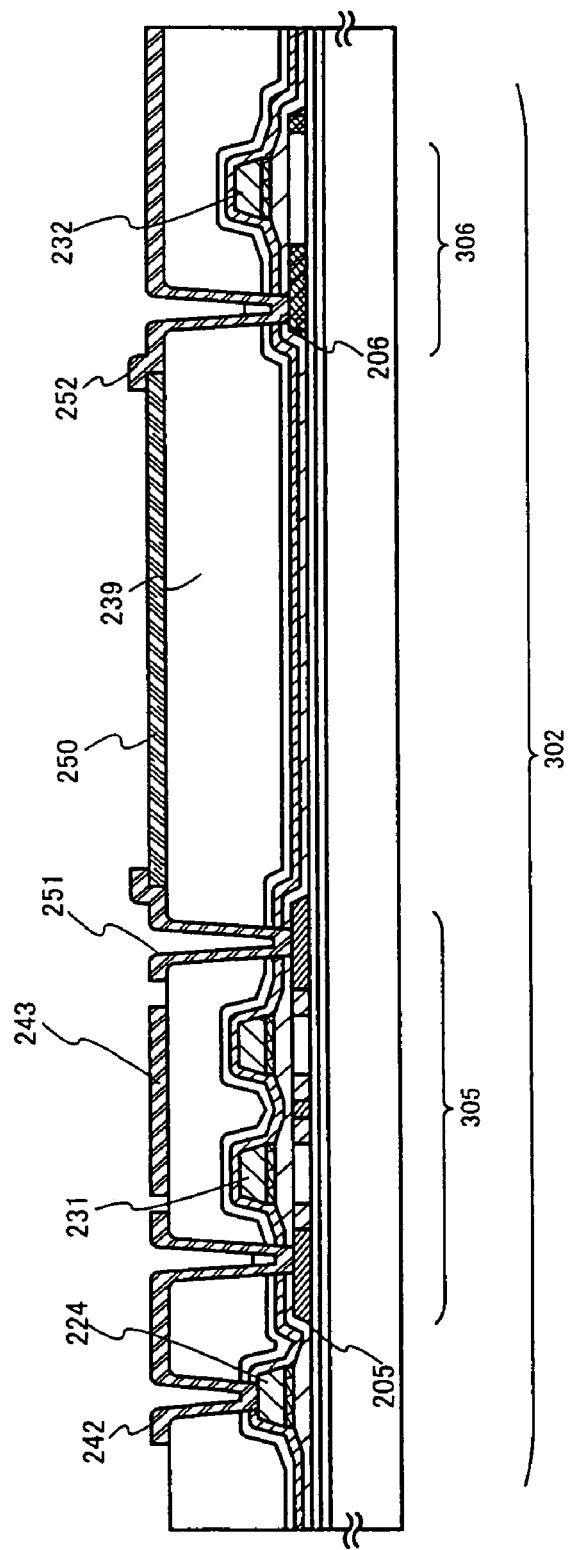
FIG. 9 is a cross sectional view illustrating the construction of a pixel portion of an active matrix substrate that is produced with the technique of the present invention and is applicable to a transmission-type display apparatus.

In this embodiment, the construction of the active matrix substrate used to form a transmission-type display apparatus will be described with reference to FIG. 9. In FIG. 9, there is shown the construction of the pixel portion 302 of the active matrix substrate formed in the first embodiment. The n-channel type TFT 305 and the storage capacitor 306 are formed in the same manner as in the first embodiment.

In order to produce an active matrix substrate that is applicable to a transmission-type display apparatus, it is required to form a translucent pixel electrode. After contact holes are established in the third interlayer insulating film 239 like in the first embodiment, a translucent pixel electrode 250 is formed using ITO or the like. Following this, there are formed the connection electrode 242, the gate line 243, the connection wiring 251 connecting the first n-type semiconductor region of the n-channel type TFT 305 to the pixel electrode 250, and a connection wiring 252 connecting the semiconductor film 206 forming one of the electrodes of the storage capacitor 306 to the pixel electrode 250. With this construction, it becomes possible to produce an active matrix substrate that is applicable to a transmission-type display apparatus.

Third Embodiment

Figure 12:
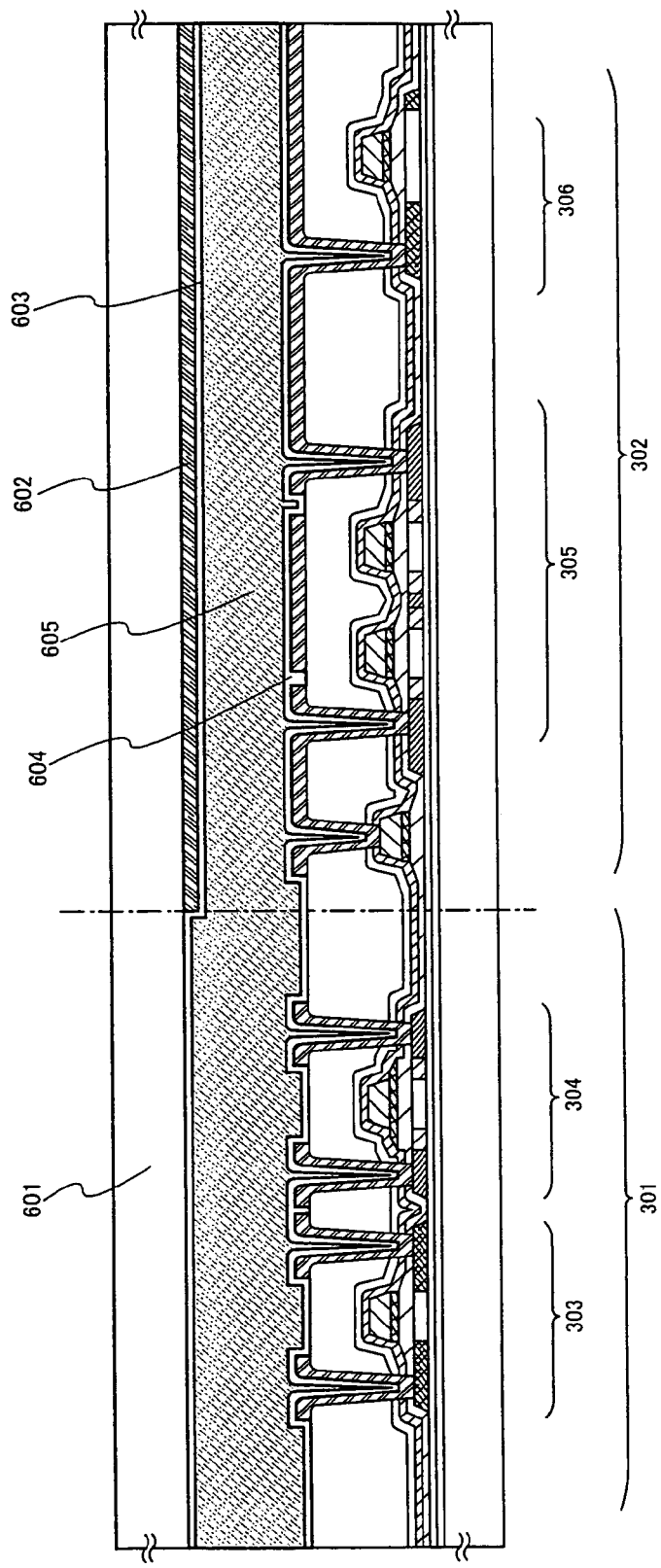
FIG. 12 is a cross sectional view illustrating the construction of a liquid crystal display apparatus produced with the technique of the present invention.

In this embodiment, there will be described a process for producing a liquid crystal display apparatus performing active matrix driving using the active matrix substrate produced in the first embodiment. The following description will be made with reference to FIG. 12.

First, according to the first embodiment, an active matrix substrate under the condition shown in FIG. 7A is obtained. Then, an orientation film 604 is formed on the active matrix substrate and a rubbing process is performed. Note that although not shown in the drawing, before the orientation film 604 is formed, pole-like spacers for maintaining a space between substrates may be formed at desired positions by patterning an organic resin film, such as an acrylic resin film. Also, instead of the pole-like spacers, ball-like spacers may be distributed around the entire of the substrates.

Next, an opposing electrode 602 is formed on an opposing substrate 601, an orientation film 603 is formed on the entire surface of the opposing substrate 601, and a rubbing process is performed. The opposing electrode 602 is made of ITO. Then, the active matrix substrate, on which the pixel portion and the driving circuit have been formed, and the opposing substrate are bonded together using a seal agent (not shown). Filler is blended into the seal agent and the two substrates are bonded together so that a uniform space is maintained therebetween by this filler and the spacers. Following this a liquid crystal material 605 is injected between both of these substrates and these substrates are completely sealed with a sealing agent (not shown). A known liquid crystal material may be used as the liquid crystal material. In this manner, there is obtained the liquid crystal display apparatus shown in FIG. 12 that performs active matrix driving.

Fourth Embodiment

Figure 13:
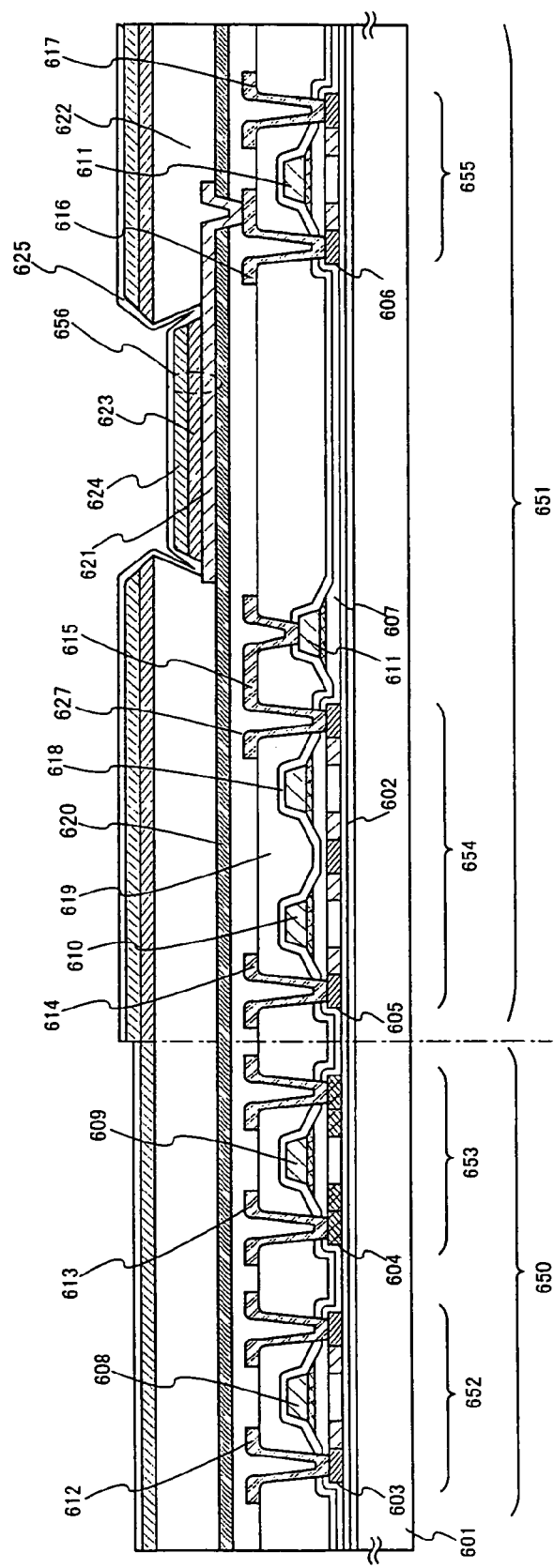
FIG. 13 is a cross sectional view illustrating the construction of a light-emitting apparatus produced with the technique of the present invention.

FIG. 13 shows an example of the construction of a light-emitting apparatus employing an active matrix driving scheme. In this example, an n-channel type TFT 652 and a p-channel type TFT 653 in a driving circuit portion 650 and a switching TFT 654 and a current control TFT 655 in a pixel portion 651 are produced in the same manner as in the first embodiment.

On the gate electrodes 608 to 611, there are formed the first interlayer insulating films 618 that are made of silicon nitride or silicon oxynitride and are used as protecting films. Further, the second interlayer insulating films 619 are formed using an organic resin material, such as polyimide or acrylic, as flattening films.

The circuit construction of the driving circuit portion 650 is not described here, although the circuit construction of a gate signal side driving circuit differs from that of a data signal side driving circuit. Wirings 612 and 613 are connected to the n-channel type TFT 652 and the p-channel type TFT 653. A shift register, a latch circuit, a buffer circuit, and the like are formed using these TFTs.

In the pixel portion 651, a data wiring 614 is connected to the source side of the switching TFT 654 and a wiring 615 on the drain side is connected to a gate electrode 611 of the current control TFT 655. Also, the source side of the current control TFT 655 is connected to a power supply wiring 617 and an electrode 616 on the drain side is connected to an anode of a light-emitting element.

On these wirings, there is formed the second interlayer insulating film 627 using an organic insulating material. The organic insulating material has hygroscopicity and has a property of occluding $H_2O$. When $H_2O$ is reemitted, oxygen is supplied to an organic compound and this becomes a cause of the degradation of the organic light-emitting element. Therefore, in order to prevent the occlusion and reemission of $H_2O$, the third insulating film 620 is formed on the second interlayer insulating film 627 using silicon nitride or silicon oxynitride. It is also possible to instead use only the third insulating film 620 by omitting the second interlayer insulating film 627.

An organic light-emitting element 656 is formed on the third insulating film 620 and is composed of: an anode 621 formed using a transparent conductive material such as ITO (indium tin oxide); an organic compound layer 623 including a hole injecting layer, a hole transporting layer, a light-emitting layer, and the like; and a cathode 624 formed using a material, such as an alkali metal (like MgAg or LiF) or an alkaline earth metal. The detailed construction of the organic compound layer 623 is arbitrarily determined, although one example thereof is shown in FIG. 5 related to the second embodiment mode.

It is impossible to subject the organic compound layer 623 and the cathode 624 to a wet process (process like etching using a chemical solution or washing with water), so that a partition layer 622 formed using a photosensitive resin material is provided above the organic insulating film 619 with reference to the anode 621. This partition layer 622 is formed so as to cover an edge portion of the anode 622. In more detail, the partition layer 622 is formed by applying a nega-type resist so as to have a thickness of around 1 to 2 μm after baking. Following this, exposure is performed by irradiating ultraviolet rays using a photomask having a predetermined pattern. If a nega-type resist material whose transmittance is low is used, the rate at which exposure is performed in the thickness direction of the layer changes. If this photomask is developed, the partition layer has a shape in which the upper portion protrudes in a direction parallel to the substrate (so-called overhang shape), as shown in FIG. 6. Needless to say, it is also possible to form such a partition layer using photosensitive polyimide or the like.

The cathode 624 is made of a material containing magnesium (Mg), lithium (Li), or calcium (Ca) having a small work function. Preferably, an electrode made of MgAg (a material obtained by mixing Mg and Ag at a ratio of Mg:Ag=10:1) is used. Alternatively, there may be used an MgAgAl electrode, an LiAl electrode, or an LiFAl electrode. Further, on this layer, the fourth insulating film 625 is formed using silicon nitride or a DLC film so as to have a thickness of 2 to 30 nm, preferably 5 to 10 nm. It is possible to form the DLC film with a plasma CVD method and even if this film is formed at a temperature of 100° C. or below, it is possible to form this film so that the edge portions of the partition layer 622 are covered with excellent coverage. It is possible to suppress the internal stress of the DLC film by mixing a very small amount of oxygen or nitrogen and to use the DLC film as a protecting film. Also, it is known that the DLC film exhibits a superior gas barrier property against oxygen, CO, $CO_2$, $H_2O$, and the like. It is preferable that the fourth insulating film 625 is formed immediately after the cathode 624 is formed without leaving this cathode in the air. This is because the condition of the interface between the cathode 624 and the organic compound layer 623 significantly affect the luminous efficiency of the organic light-emitting element.

As described above, it becomes possible to prevent the occurrence of cracks due to thermal stresses by forming the organic light-emitting element in which the organic compound layer 623 and the cathode layer 624 are formed so as not to contact the partition layer 622. Also, the organic light-emitting element 656 is most vulnerable to oxygen and $H_2O$, so that a silicon nitride film or silicon oxynitride film and a DLC film 625 are formed to block them. In addition, these films have another function of preventing an alkali metal element possessed by the organic light-emitting element 656 from escaping to the outside.

In FIG. 13, the switching TFT 654 has a multi-gate structure and a lightly doped drain (LDD) overlapping the gate electrode is provided for the current control TFT 655. If a TFT uses a polycrystalline silicon film, this TFT exhibits a high operating speed. This means that degradation, such as hot carrier injection, tends to occur in such a TFT. As a result, the construction shown in FIG. 6, in which TFTs (a switching TFT whose off-current is sufficiently small and a current control TFT that is resistant to hot carrier injection) having different constructions are formed according to their functions in a pixel, is highly effective at producing a display apparatus that has high reliability and is also capable of displaying fine images (has high operation performance).

As shown in FIG. 13, the first insulating film 602 is formed on the lower layer side (on the substrate 601 side) of the semiconductor film forming the TFTs 654 and 655. On the upper layer side that is the opposite side, there is formed the first insulating film 618. On the other hand, on the lower layer side of the organic light-emitting element 656, there is formed the third insulating film 620. On the upper layer side of the organic light-emitting element 656, there is formed the fourth insulating film 625. Then, the organic insulating film 619 is formed between them and these components are integrated with each other. The TFTs 654 and 655 are most vulnerable to alkali metals, such as sodium, and the pollution source of these alkali metals may be the substrate 601 and the organic light-emitting element 656. However, these alkali metals are blocked by surrounding the substrate 601 using the first insulating film 602 and the second insulating film 618. On the other hand, the organic light-emitting element 656 is most vulnerable to oxygen and $H_2O$. Therefore, in order to block them, there are formed the third insulating film 620 and the fourth insulating film 625. These films also have a function of preventing the alkali metal element possessed by the organic light-emitting element 656 from escaping to the outside.

As an example of an effective manufacturing method of an organic light-emitting apparatus having the construction shown in FIG. 13, there may be employed a process during which the third insulating film 620 and the anode 621 which are produced using transparent conductive films typified by ITO, are successively formed using a sputtering method. This sputtering method is suitable for the formation of a minute silicon nitride film or silicon oxynitride film without inflicting significant damage on the surface of the organic insulating film 619.

As described above, it is possible to form a pixel portion by combining TFTs with an organic light-emitting apparatus, thereby obtaining a light-emitting apparatus. In such a light-emitting apparatus, it is also possible to form a driving circuit on the same substrate using TFTs. As shown in FIG. 13, there is obtained a construction where the lower layer side and the upper layer side of a semiconductor film, a gate insulating film, and a gate electrode that are the main construction elements of a TFT are surrounded by a blocking layer and a protecting film made of silicon nitride or silicon oxynitride, thereby preventing contamination by an alkali metal or an organic matter. On the other hand, the organic light-emitting element partially contains an alkali metal and is surrounded by a protecting layer made of silicon nitride or silicon oxynitride and a gas barrier layer made of an insulating film whose main ingredient is silicon nitride or carbon. In this manner, there is obtained a construction where the entry of oxygen or $H_2O$ from the outside is prevented.

As described above, with the technique of the present invention, it becomes possible to obtain a light-emitting apparatus by combining elements that exhibit different characteristics against impurities without incurring interference between them. Further, it is possible to improve reliability by eliminating effects of stress.

Fifth Embodiment

The ability of removing the metal element having a catalyst function from the crystallized silicon film depends upon not only the temperature or the time of the gettering but also depends upon the crystallization rate. The crystallization rate is the proportion of crystal components in the entire volume or the entire area of the film.

By adding nickel to an amorphous silicon film to change the heating time, samples with a different crystallization rate are formed. Concretely, examples of the crystallization rate of the samples formed with a different heating time at heating temperature 650° C. (warm-up period: three minutes and thirty seconds) by GRTA method are shown in FIG. 17 and FIG. 18. FIG. 17 shows a result plotted the area ratio as the crystallization rate, which is obtained by observing with an optical microscope by utilizing the difference of optical transmittance between an amorphous region and a crystallized region of silicon film. FIG. 18 shows a result plotted the peak intensity ratio of TO (amorphous silicon: 480 cm$^{-1}$) and TO (crystallizaed silicon: approximately 520 cm$^{-1}$) toward the time of heating process, which are obtained from Raman spectrum. The crystallinity can be changed in the range of approximately 95 to 99.9%.

Gettering is carried out after irradiating the silicon film (XeCl excimer laser, 480 mJ/cm$^2$). The crystallization rate of the silicon film is approximately 100% after irradiating by laser light. Under such a condition, the residual nickel concentration is investigated in the case of heating for three minutes at 625° C. and 650° C. (warm-up period is three minutes and thirty seconds respectively). The nickel concentration is measured by TXRF (Total Reflection X-Ray Fluorescence) method. FIG. 19 shows a result of gettering at 625° C., in which the residual nickel concentration is varied widely and becomes higher as the crystallization rate is high. The other side, correlation does not appear in the case of gettering at 650° C. as shown in FIG. 20.

It is assumed that the residual nickel concentration depends on the crystallization rate before irradiation of laser light. The reason why the residual nickel concentration becomes higher in the case of very high crystallization rate is assumed that nickel silicide is deposited in grain boundary and deposition of nickel or nickel silicide is increased. This shows that nickel becomes harder to move to a gettering site when the heating temperature of gettering goes down. Therefore, from the point of ensuring a tolerance of processing condition of gettering, it is preferable to set the crystallization rate, especially to set in approximately 95-99%.

Sixth Embodiment

In this embodiment, the dependency of the gettering ability to the laser irradiation condition will be explained with respect to the silicon film of which crystallinity has been increased by the laser irradiation.

FIG. 21 shows the concentration distribution of nickel which was added as a metal element for promoting crystallization as measured by secondary ion mass spectroscopy. The sample silicon film is obtained by irradiating the crystallized silicon film with lasers having various energy densities after heat crystallization using nickel. The laser irradiation was performed by using a pulsed oscillation XeCl excimer laser having a wavelength of 308 nm with a repetition frequency of 30 Hz and a same region is repeatedly irradiated at 12 times. The results obtained with the laser energy densities of 380 mJ/cm$^2$ and 550 mJ/cm were compared to the result obtained with the energy density of 480 mJ/cm$^2$ as a standard density.

FIG. 21 shows the depth profile of nickel concentration in the crystallized silicon film. It is understood from FIG. 21 that the higher the laser energy density, the more the nickel is segregated at the surface of the silicon film. The inventor(s) considers this is because after the silicon film melts due to the laser irradiation, the film solidifies from the portion close to the underlying film (i.e. the substrate side) and the solid-liquid interface moves toward the surface. Namely, it is understood that the nickel concentration becomes higher at the surface which is finally solidified because the nickel is segregated in the liquid having a higher solid solubility. FIG. 22 shows the result of a TXRF measurement, showing the nickel concentration at the surface of the silicon film which is crystallized with the laser energy densities varied from 240 to 550 mJ/cm$^2$. In FIG. 22, the nickel concentration at the surface of the crystallized semiconductor film rapidly increases when the laser energy density exceeds 360 mJ/cm$^2$.

Thus, the energy density of 360 mJ/cm$^2$ can be regarded as a critical point. FIG. 22 and FIG. 23 shows that the silicon film is crystallized through the molten state in the energy density of 360 mJ/cm$^2$ or more.

Figure 24:
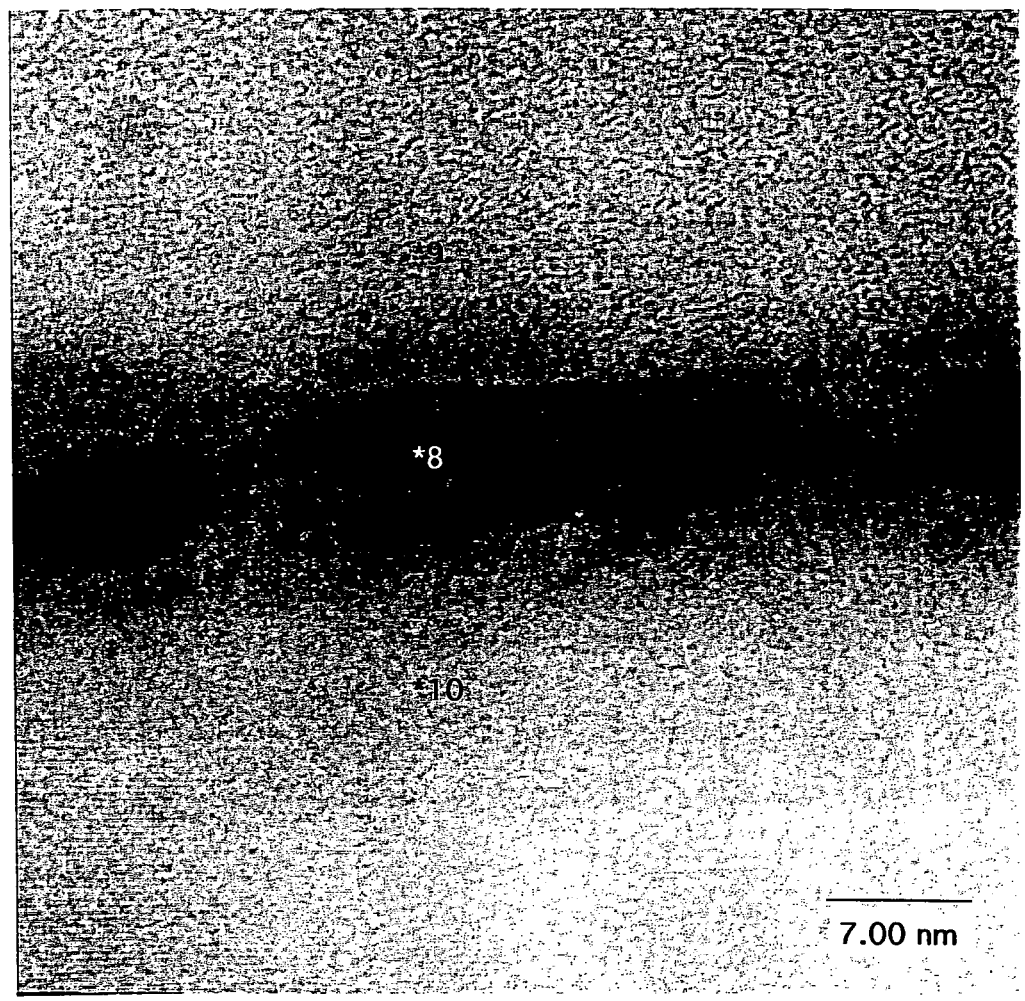
FIG. 24 shows the high resolution transmission electron microscope photograph of the vicinity of the crystal grain boundary.
Figure 25A:
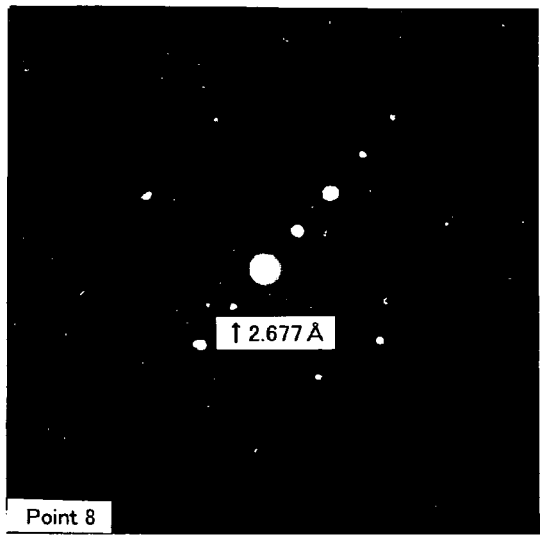
FIGS. 25A to 25C shows the electron diffraction image of the vicinity of the crystal grain boundary; and Table 1 shows the distance of the lattice planes as obtained from the electron diffraction image.
Figure 25B:
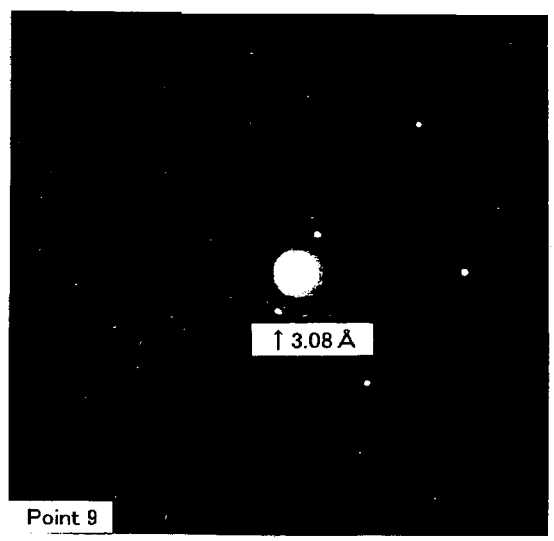
Figure 25C:
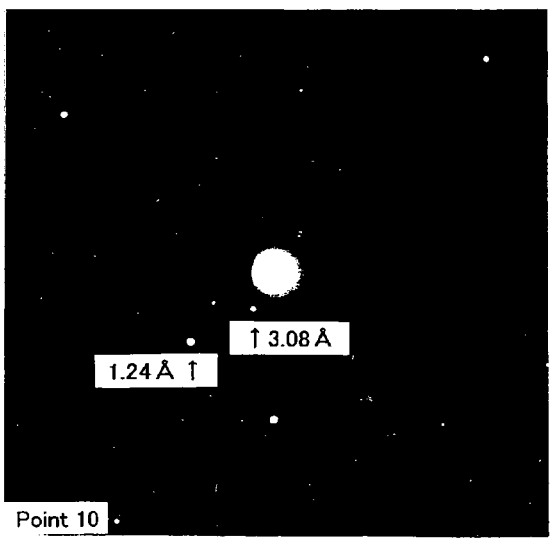

FIG. 24 shows the high resolution transmission electron microscope photograph and FIG. 25 shows the electron diffraction image of the vicinity of the crystal grain boundary, respectively. The sample was the crystallized semiconductor film after performing the laser irradiation at 480 mJ/cm$^2$. In FIG. 24, a lattice fringe image of nickel silicide can be observed. The distance of the lattice planes as obtained from the electron diffraction image of FIG. 25 is shown in Table 1. In view of this table, it is understood that the nickel silicide existing at the grain boundaries is $Ni_3Si_2$ or $Ni_2Si$ but not $NiSi_2$. It is considered that the nickel melted by the laser irradiation was frozen at the grain boundaries in the form of $Ni_3Si_2$ or $Ni_2Si$ due to supercooling. We presume that the $NiSi_2$ present at the grain boundaries before the laser irradiation changes to the $Ni_3Si_2$ or $Ni_2Si$ due to the energy of the laser. Since $Ni_3Si_2$ or $Ni_2Si$ are more unstable than $NiSi_2$ the nickel can be more easily removed from the silicide.

Seventh Embodiment

The various semiconductor devices can be formed by using the present invention. As the semiconductor devices of the present invention there are: a video camera; a digital camera; a goggle type display (head mounted display); a car navigation system; a sound reproduction device (a car audio stereo and an audio set and so forth); a notebook type personal computer; a game apparatus; a portable information terminal (such as a mobile computer, a portable telephone, a portable game machine, or an electronic book); and an image playback device equipped with a recording medium. Specific examples of those electronic equipments are shown in FIGS. 15A to 16C.

Figure 15A:
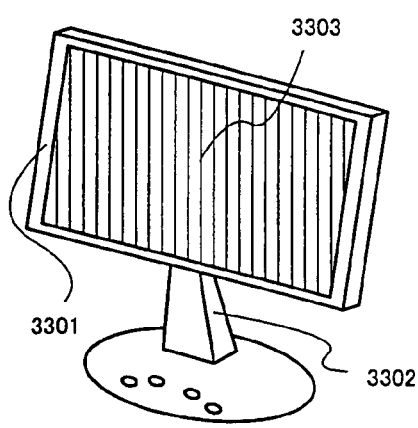
FIGS. 15A to 15F each show an example of a semiconductor device.

FIG. 15A shows a monitor of a desktop personal computer containing a casing 3301, a support stand 3302, and a display portion 3303. The light-emitting device of the present invention can be used as the display portion 3303. By using the present invention, the display portion 3303 and other integrated circuit can be formed.

Figure 15B:
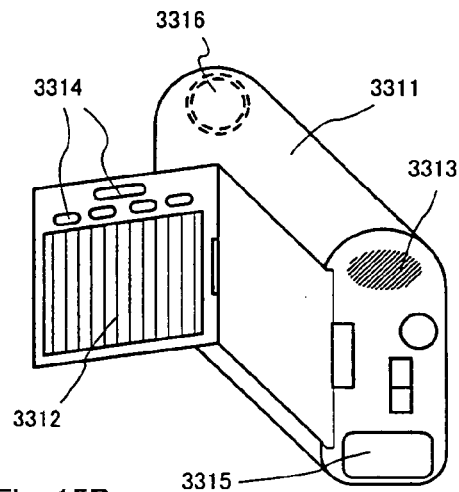

FIG. 15B shows a video camera, and contains a main body 3311, a display portion 3312, a sound input portion 3313, operation switches 3314, a battery 3315, and an image receiving portion 3316. By using the present invention, the display portion 3312 and other integrated circuit can be manufactured.

Figure 15C:
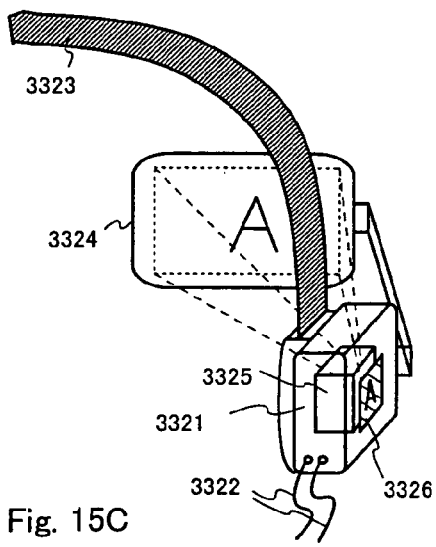

FIG. 15C shows a part of a head mounted EL display device (right handed side), and contains a main boy 3321, a signal cable 3322, a head fixation band 3323, a projection portion 3324, an optical system 3325 and a display portion 3326. By using the present invention, the display portion 3326 and other integrated circuit can be manufactured.

Figure 15D:
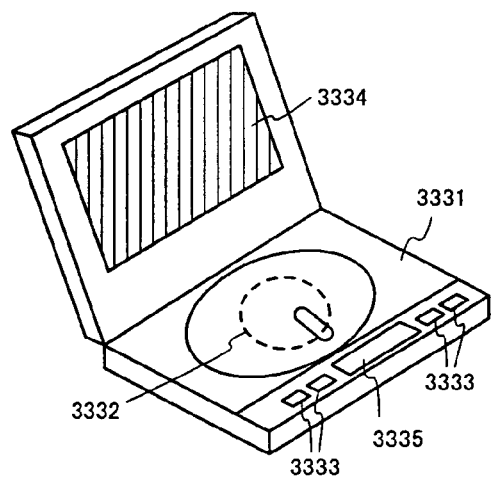

FIG. 15D is an image playback device equipped with a recording medium (specifically, a DVD playback device), and contains a main body 3331, a recording medium (such as a DVD and so forth) 3332, operation switches 3333, a display portion (a) 3334, and a display portion (b) 3335. The display portion (a) 3334 is mainly used for displaying image information. The display portion (b) 3335 is mainly used for displaying character information. By using the present invention, the display portion (a) 3334 and (b) 3335 and other integrated circuit can be manufactured. Note that the image playback device equipped with the recording medium includes devices such as domestic game machines.

Figure 15E:
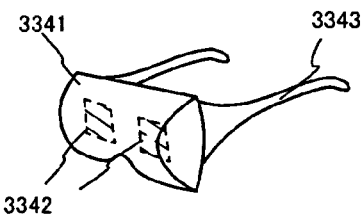

FIG. 15E shows a goggle type display device (a head mounted display device), and contains a main body 3341, a display portion 3342, and an arm portion 3343. By using the present invention, the display portion 3342 and other integrated circuit can be manufactured.

Figure 15F:
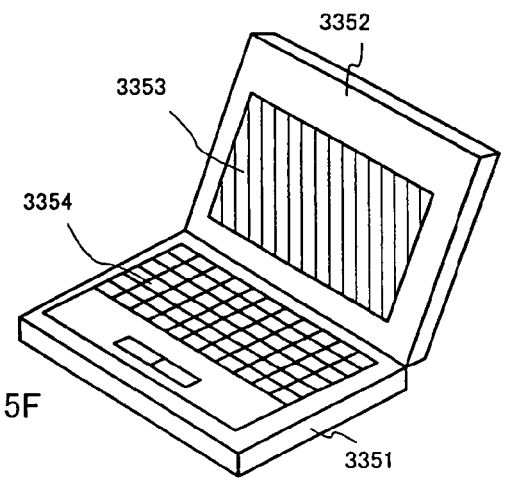

FIG. 15F is a laptop type personal computer, and contains a main body 3351, a casing 3352, a display portion 3353, and a keyboard 3354. By using the present invention, the display portion 3353 and other integrated circuit can be manufactured.

FIG. 16A shows a portable telephone, and contains a main body 3401, a sound output portion 3402, a sound input portion 3403, a display portion 3404, operation switches 3405, and an antenna 3406. By using the present invention, the display portion 3404 and other integrated circuit can be manufactured.

FIG. 16B shows a sound reproduction device, in a concrete term, a car audio stereo, and contains a main body 3411, a display portion 3412, and operation switches 3413 and 3414. The light emitting device of the present invention can be used to the display portion 3412. Further, a car mounting audio stereo is shown in this embodiment but a portable type or a domestic type sound reproduction device may also be used.

FIG. 16C shows a digital camera, and contains a main body 3501, a display portion (A) 3502, an eye piece portion 3503, and an operation switches 3504, a display portion (B) 3505, a battery 3506. By using the present invention, the display portion (A) 3502 and (B) 3505 and other integrated circuit can be manufactured.

As described above, the application range of this invention is extremely wide, and it may be used for electric devices in various fields. Further, the electronic device of this embodiment may be obtained by freely combining any of the structures shown in First Embodiment to Sixth Embodiment.

With the technique of the present invention, it becomes possible to effectively remove or reduce a catalytic element from a semiconductor film having a crystal structure obtained using the catalytic element that promotes crystallization. There is also a feature that it is possible to perform this process at a low temperature at which there occurs no distortion and deformation of a glass substrate.

Also, a rare gas element added to a semiconductor film in order to perform gettering is inert in the semiconductor film, so that there occurs no adverse effect, such as the variations of threshold voltages of TFTs. Also, it is possible to supply the rare gas element added with an ion implantation method or an ion-doping method under a condition where the rare gas element is of high purity and does not contain any balance gas. This shortens the time required to perform doping and improves the productivity of a semiconductor device.

Further, a semiconductor film having a crystal structure produced with the technique of the present invention excels in crystallinity because of the effects of a catalytic element. Also, the catalytic element is removed or is reduced by gettering. As a result, in the case where this semiconductor film is used as an active layer of a semiconductor device, it becomes possible to obtain a semiconductor device having superior electric characteristics as well as high reliability.

What is claimed is:

1. A method of manufacturing a semiconductor device comprising:

forming a first semiconductor film comprising an amorphous silicon over a substrate having an insulating surface;

adding a material comprising a metal for promoting crystallization to the first semiconductor film;

performing a first heating process to the first semiconductor film, thereby forming the first semiconductor film having a crystal structure;

forming a barrier layer on a surface of the first semiconductor film having the crystal structure;

forming a second semiconductor film containing a rare gas element by using a mixed gas of the rare gas and hydrogen on the barrier layer, whereby the second semiconductor film has low density to enhance etching selectivity with the first semiconductor film having the crystal structure;

performing gettering through. a second heating process, thereby moving the metal for promoting crystallization to the second semiconductor film;

removing the second semiconductor film; and irradiating the first semiconductor film having the crystal structure with laser light.

2. A method of manufacturing a semiconductor device according to claim 1, wherein the rare gas element is added simultaneously with the formation of the second semiconductor film.

3. A method of manufacturing a semiconductor device according to claim 1, wherein the rare gas element is added after the formation of the second semiconductor film.

4. A method of manufacturing a semiconductor device according to claim 1, wherein the barrier layer is formed from a chemical oxide film that is formed using ozone water.

5. A method of manufacturing a semiconductor device according to claim 1, wherein the barrier layer is formed by oxidizing a surface of the barrier layer through a plasma process.

6. A method of manufacturing a semiconductor device according to claim 1, wherein the barrier layer is formed by oxidizing a surface of the barrier layer by generating ozone through irradiation with ultraviolet rays in an oxygen containing atmosphere.

7. A method of manufacturing a semiconductor device according to claim 1, wherein the rare gas element is at least one selected from the group consisting of He, Ne, Ar, Kr, and Xe.

8. A method of manufacturing a semiconductor device according to claim 1, wherein the rare gas element is added using one of an ion implantation method and an ion doping method.

9. A method of manufacturing a semiconductor device according to claim 1, wherein the first heating process is performed by radiation from a light source, the light source comprising at least one selected from the group consisting of a halogen lamp, a metal halide lamp, a xenon arc lamp, a carbon arc lamp, a high pressure sodium lamp, and a high pressure mercury lamp.

10. A method of manufacturing a semiconductor device according to claim 1, wherein the first heating process is performed with a furnace annealing method that uses an electric heating furnace.

11. A method of manufacturing a semiconductor device according to claim 1, wherein the second heating process is performed by radiation from a light source, the light source comprising at least one selected from the group consisting of a halogen lamp, a metal halide lamp, a xenon arc lamp, a carbon arc lamp, a high pressure sodium lamp, and a high pressure mercury lamp.

12. A method of manufacturing a semiconductor device according to claim 1, wherein the second heating process is performed with a furnace annealing method that uses an electric heating furnace.

13. A method of manufacturing a semiconductor device according to claim 1, wherein the metal for promoting crystallization is at least one selected from the group consisting of Fe, Ni, Co, Ru, Rh, Pd, Os, Ir, Pt, Cu, and Au.

14. A method for manufacturing a semiconductor device according to claim 1, wherein the second semiconductor film is formed by a plasma CVD method and a high-frequency sputtering method.

15. A method for manufacturing a semiconductor device. according to claim 1, wherein the second semiconductor film contains 25 to 40 atom % hydrogen.

16. A method for manufacturing a semiconductor device according to claim 1, wherein the laser light is a second harmonic or a third harmonic of a solid-state laser.

17. A method of manufacturing a semiconductor device comprising:
   forming a first semiconductor film comprising an amorphous silicon over a substrate having an insulating surface;
   adding a material comprising a metal for promoting crystallization to the first semiconductor film;
   performing a first heating process to the first semiconductor film, thereby forming the first semiconductor film having a crystal structure;
   forming a barrier layer on a surface of the first semiconductor film having the crystal structure;
   forming a second semiconductor film containing a rare gas element by using a mixed gas of the rare gas and hydrogen on the barrier layer, whereby the second semiconductor film has low density to enhance etching selectivity with the first semiconductor film having the crystal structure;
   performing gettering through a second heating process, thereby moving the metal for promoting crystallization to the second semiconductor film;
   removing the second semiconductor film;
   removing the barrier layer after removing the second semiconductor film; and
   irradiating the first semiconductor film having the crystal structure with laser light.

18. A method of manufacturing a semiconductor device according to claim 17, wherein the rare gas element is added simultaneously with the formation of the second semiconductor film.

19. A method of manufacturing a semiconductor device according to claim 17, wherein the rare gas element is added after the formation of the second semiconductor film.

20. A method of manufacturing a semiconductor device according to claim 17, wherein the barrier layer is formed from a chemical oxide film that is formed using ozone water.

21. A method of manufacturing a semiconductor device according to claim 17, wherein the barrier layer is formed by oxidizing a surface of the barrier layer through a plasma process.

22. A method of manufacturing a semiconductor device according to claim 17, wherein the barrier layer is formed by oxidizing a surface of the barrier layer by generating ozone through irradiation with ultraviolet rays in an oxygen containing atmosphere.

23. A method of manufacturing a semiconductor device according to claim 17, wherein the rare gas element is at least one selected from the group consisting of He, Ne, Ar, Kr, and Xe.

24. A method of manufacturing a semiconductor device according to claim 17, wherein the rare gas element is added using one of an ion implantation method and an ion doping method.

25. A method of manufacturing a semiconductor device according to claim 17, wherein the first heating process is performed by radiation from a light source, the light source comprising at least one selected from the group consisting of a halogen lamp, a metal halide lamp, a xenon arc lamp, a carbon arc lamp, a high pressure sodium lamp, and a high pressure mercury lamp.

26. A method of manufacturing a semiconductor device according to claim 17, wherein the first heating process is performed with a furnace annealing method that uses an electric heating furnace.

27. A method of manufacturing a semiconductor device according to claim 17, wherein the second heating process is performed by radiation from a light source, the light source comprising at least one selected from the group consisting of a halogen lamp, a metal halide lamp, a xenon arc lamp, a carbon arc lamp, a high pressure sodium lamp, and a high pressure mercury lamp.

28. A method of manufacturing a semiconductor device according to claim 17, wherein the second heating process is performed with a furnace annealing method that uses an electric heating furnace.

29. A method of manufacturing a semiconductor device according to claim 17, wherein the metal for promoting crystallization is at least one selected from the group consisting of Fe, Ni, Co, Ru, Rh, Pd, Os, Ir, Pt, Cu, and Au.

30. A method for manufacturing a semiconductor device according to claim 17, wherein the second semiconductor film is formed by a plasma CVD method and a high-frequency sputtering method.

31. A method for manufacturing a semiconductor device according to claim 17, wherein the second semiconductor film contains 25 to 40 atom % hydrogen.

32. A method for manufacturing a semiconductor device according to claim 17, wherein the laser light is a second harmonic or a third harmonic of a solid-state laser.

* * * * *